(12) United States Patent
Park

(10) Patent No.: US 9,362,289 B2
(45) Date of Patent: Jun. 7, 2016

(54) SEMICONDUCTOR DEVICE INCLUDING LANDING PAD

(71) Applicant: Samsung Electronics Co., Ltd., Suwon-Si, Gyeonggi-Do (KR)

(72) Inventor: Je-min Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/581,012

(22) Filed: Dec. 23, 2014

(65) Prior Publication Data

US 2015/0214152 A1 Jul. 30, 2015

(30) Foreign Application Priority Data

Jan. 28, 2014 (KR) ........................ 10-2014-0010887

(51) Int. Cl.
*H01L 27/108* (2006.01)

(52) U.S. Cl.
CPC .... *H01L 27/10876* (2013.01); *H01L 27/10814* (2013.01); *H01L 27/10855* (2013.01); *H01L 2924/0002* (2013.01)

(58) Field of Classification Search
CPC .............................................. H01L 27/10814
USPC ......................................................... 257/775
See application file for complete search history.

(56) References Cited

U.S. PATENT DOCUMENTS

| | | | | |
|---|---|---|---|---|
| 6,268,252 B1 * | 7/2001 | Lee | ................... | H01L 21/31116 257/E21.252 |
| 6,285,053 B1 * | 9/2001 | Park | ................... | H01L 27/10855 257/303 |
| 6,693,360 B1 * | 2/2004 | Dei | ................... | H01L 21/76804 257/750 |
| 6,730,570 B2 * | 5/2004 | Shin | ................... | H01L 21/76831 257/346 |
| 6,744,096 B2 * | 6/2004 | Lee | ................... | H01L 21/76895 257/316 |
| 7,755,201 B2 * | 7/2010 | Kim | ................... | H01L 21/76804 257/666 |
| 8,198,189 B2 * | 6/2012 | Kim | ................... | H01L 21/7682 438/619 |
| 8,344,517 B2 | 1/2013 | Kim et al. | | |
| 8,828,829 B2 * | 9/2014 | Joung | ................... | H01L 21/764 438/294 |
| 2002/0027288 A1 * | 3/2002 | Lee | ................... | H01L 27/10888 257/758 |
| 2011/0037111 A1 * | 2/2011 | Kim | ................... | H01L 29/4236 257/302 |
| 2012/0168899 A1 * | 7/2012 | Kim | ................... | H01L 21/7682 257/522 |
| 2013/0093093 A1 * | 4/2013 | Lee | ................... | H01L 27/10855 257/770 |
| 2014/0077333 A1 * | 3/2014 | Son | ................... | H01L 21/7682 257/522 |
| 2015/0214152 A1 * | 7/2015 | Park | ................... | H01L 27/10814 257/754 |

FOREIGN PATENT DOCUMENTS

| | | |
|---|---|---|
| KR | 10-0753031 B1 | 8/2007 |
| KR | 2009-0022618 A | 3/2009 |
| KR | 2013-0022335 A | 3/2013 |
| KR | 2013-0022872 A | 3/2013 |

* cited by examiner

*Primary Examiner* — Earl Taylor
(74) *Attorney, Agent, or Firm* — Harness, Dickey & Pierce, P.L.C.

(57) ABSTRACT

The semiconductor device includes a plurality of conductive line structures including a plurality of conductive lines spaced apart from a substrate with an insulating film there between and insulating capping layers that are formed on each of plurality of conductive lines; an insulating spacer that is disposed between the plurality of conductive line structures and covers both side walls of each of the plurality of conductive line structures to define a contact hole having a first width in a first direction parallel to an upper surface of the substrate; a contact plug filling a portion of the contact hole; and a landing pad that is connected to the contact plug and vertically overlapping with one of the plurality of conductive line structures.

19 Claims, 47 Drawing Sheets

SEMICONDUCTOR DEVICE INCLUDING LANDING PAD

CROSS-REFERENCE TO RELATED APPLICATIONS

This application claims the benefit of Korean Patent Application No. 10-2014-0010887, filed on Jan. 28, 2014, in the Korean Intellectual Property Office, the disclosure of which is incorporated herein in its entirety by reference.

BACKGROUND

The inventive concepts relate to a semiconductor device, and more particularly, to a semiconductor device including a landing pad for connecting a capacitor lower electrode and a plurality of active areas of a substrate.

As the degree of integration of a semiconductor device increases, design rules for elements of the semiconductor device decrease. In a highly integrated semiconductor device, cross-sectional areas of a plurality of conductive lines and contact plugs between the conductive lines gradually decrease. Accordingly, when a capacitor lower electrode that is formed on the contact plug having a reduced cross-sectional area is connected to a plurality of active areas of a substrate through the contact plug, a contact area with the contact plug is limited, and thus there is a limitation in reducing contact resistance.

SUMMARY

The inventive concepts provide a semiconductor device that may solve a bridge phenomenon between landing pads when the landing pads each of which connects a capacitor lower electrode to a plurality of active areas of a substrate through a contact plug having a reduced cross-sectional area in a semiconductor device having a small unit cell size due to integration are manufactured.

According to an aspect of the inventive concepts, there is provided a semiconductor device including: a substrate having a plurality of active areas; a plurality of conductive line structures including a plurality of conductive lines that are spaced apart from the substrate with an insulating film there between and insulating capping layer that are formed on each of the plurality of conductive lines; an insulating spacer that is disposed between the plurality of conductive line structures the insulating spacer covering both side walls of each of the plurality of conductive line structures to define a contact hole having a first width in a first direction parallel to an upper surface of the substrate; a contact plug filling a portion of the contact hole; and a landing pad connected to the contact plug and vertically overlapping with one of the plurality of conductive line structures, wherein a lower end portion of the landing pad has a second width less than the first width in the first direction and an upper end portion of the landing pad has a third width greater than the first width in the first direction, wherein a fourth width of an upper end portion of the insulating capping layer in the first direction is less than a fifth width of a lower end portion of the insulating capping layer.

A cross-section of the insulating capping layer in the first direction may taper such that a width decreases from the lower end portion to the upper end portion of the insulating capping layer.

A level of an uppermost portion of the insulating spacer may be lower than a level of an uppermost portion of the insulating capping layer.

The insulating spacer may include an air spacer.

The semiconductor device may further include an insulating pattern that contacts a side surface of the upper end portion of the insulating capping layer and contacts an upper portion of the insulating spacer formed on a same side surface as the one side surface of the upper end portion of the insulating capping layer.

The contact plug may extend from an inside of the contact hole to an outside of the contact hole and vertically overlap with an upper portion of the insulating capping layer and an upper portion of the insulating spacer.

The semiconductor device may further include a metal silicide film disposed in the contact hole, the metal silicide film being disposed between the contact plug and the landing pad, wherein a level of a top surface of the metal silicide film is lower than a level of a top surface of the insulating capping layer.

The semiconductor device may further include a metal silicide film that is formed between the contact plug and the landing pad, wherein the metal silicide film is formed outside the contact hole and over the upper portion of the insulating capping layer.

The semiconductor device may further include a conductive barrier film that contacts a side surface and a top surface of the insulating spacer and a side surface of an upper portion of the insulating capping layer, and surrounds the landing pad.

According to another aspect of the inventive concepts, there is provided a semiconductor device including: a substrate having a plurality of active areas; a plurality of conductive lines spaced apart from the substrate with an insulating film there between; a plurality of insulating capping layers that contact top surfaces of the plurality of conductive lines, the plurality of insulating capping layers having same widths as widths of the plurality of conductive lines; an insulating spacer contacting both side surfaces of each of the plurality of conductive lines and the plurality of insulating capping layers; and a contact plug disposed between the plurality of conductive lines and formed in a space defined by the insulating spacer, wherein a size of a width of an upper end portion of the contact plug in a first direction parallel to an upper surface of the substrate is greater than a size of a width of a lower end portion of the contact plug.

The contact plug may extend in a second direction perpendicular to the substrate to overlap with an upper portion of the insulating capping layer and an upper portion of the insulating spacer.

The semiconductor device may further include a landing pad that is connected to the contact plug and vertically overlapping with one of the plurality of conductive lines, wherein a size of a width of the landing pad in the first direction is greater than a size of a width of the upper end portion of the contact plug in the first direction.

The landing pad may have a pillar shape.

The semiconductor device may further include a metal silicide film disposed between an upper surface of the contact plug and the landing pad, wherein a size of a width of the metal silicide film in the first direction is the same as the size of the width of the upper end portion of the contact plug in the first direction.

The semiconductor device may further include an insulating pattern formed to simultaneously contact a side surface of an upper end portion of the insulating capping layer and a portion of the contact plug.

According to another aspect of the inventive concepts, there is provided a semiconductor device comprising: a substrate having a plurality of active areas; a plurality of conductive line structures including a plurality of conductive lines spaced apart from the substrate with an insulating film there between and insulating capping layer formed on each of the plurality of conductive lines; an insulating spacer disposed between the plurality of conductive line structures, the insulating spacer covering both side walls of each of the plurality of conductive line structures to define a contact hole having a first width in a first direction parallel to an upper surface of the substrate; a contact plug filling a portion of the contact hole, the contact plug being electrically connected to at least one of the plurality of active areas; a landing pad connected to the contact plug and vertically overlapping with one of the plurality of conductive line structures; and an insulating pattern contacting a side surface of the upper end portion of the insulating capping layer and an upper portion of the insulating spacer formed on the same side surface as the one side surface of the upper end portion of the insulating capping layer, wherein a lower end portion of the landing pad has a second width less than the first width in the first direction and an upper end portion of the landing pad has a third width greater than the first width in the first direction, wherein a fourth width of an upper end portion of the insulating capping layer in the first direction is less than a fifth width of a lower end portion of the insulating capping layer.

The contact plug may extend from an inside of the contact hole to an outside of the contact hole and vertically overlaps with an upper portion of the insulating capping layer and an upper portion of the insulating spacer.

The semiconductor device may further include a metal silicide film disposed in the contact hole, the metal silicide film being disposed between the contact plug and the landing pad, wherein a level of a top surface of the metal silicide film is lower than a level of a top surface of the insulating capping layer.

The semiconductor device may further include a metal silicide film that is formed between the contact plug and the landing pad, wherein the metal silicide film is formed outside the contact hole and over the upper portion of the insulating capping layer.

The semiconductor device may further include a conductive barrier film that contacts a side surface and a top surface of the insulating spacer and a side surface of an upper portion of the insulating capping layer, and surrounds the landing pad.

BRIEF DESCRIPTION OF THE DRAWINGS

Exemplary embodiments of the inventive concepts will be more clearly understood from the following detailed description taken in conjunction with the accompanying drawings in which:

FIGS. 6A through 6D, FIGS. 7A through 7D, and FIGS. 8A through 8D are cross-sectional views according to a process order for explaining a method of manufacturing the semiconductor device of FIG. 1, according to some embodiments of the inventive concepts, in which FIGS. 6A, 7A, and 8A are views taken along a line A-A' of FIG. 5, FIGS. 6B, 7B, and 8B are views taken along a line B-B' of FIG. 5, FIGS. 6C, 7C, and 8C are views taken along a line C-C' of FIG. 5, and FIGS. 6D, 7D, and 8D are views taken along a line D-D' of FIG. 5;

DETAILED DESCRIPTION OF THE EMBODIMENTS

Figure 1:
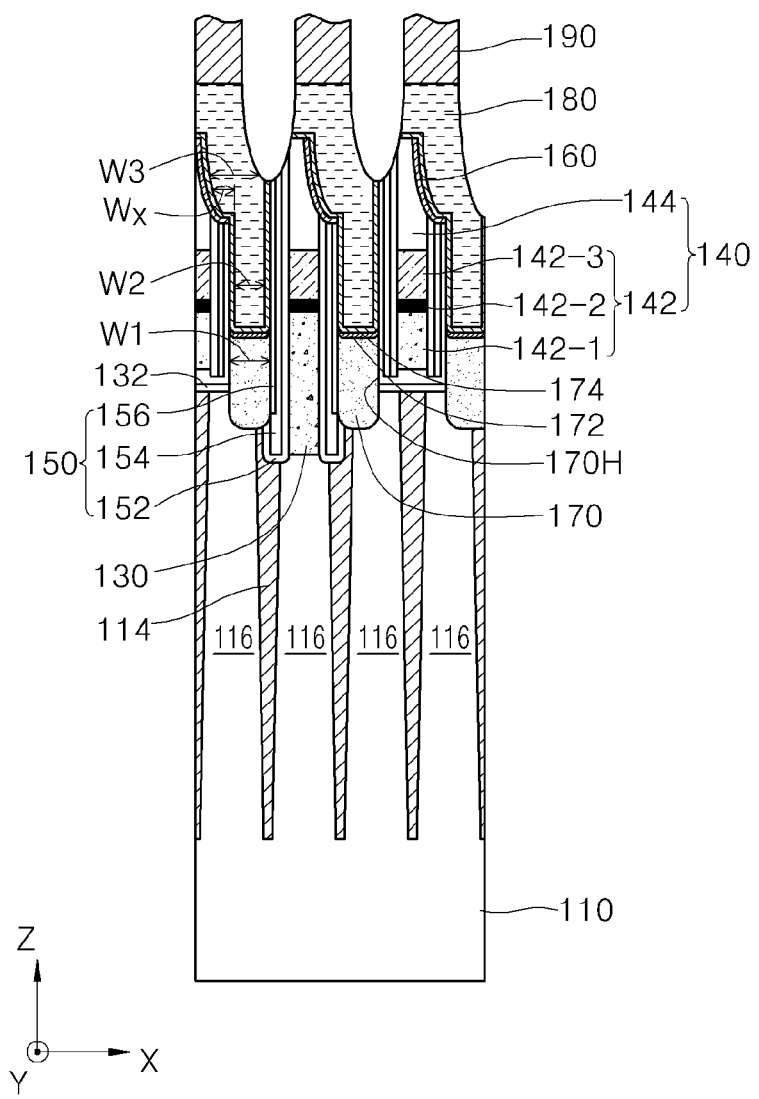
FIG. 1 is a cross-sectional view illustrating essential elements of a semiconductor device, according to an embodiment of the inventive concepts.

As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings, wherein like elements are denoted by like reference numerals and a repeated explanation thereof will not be given.

The inventive concepts will now be described more fully with reference to the accompanying drawings, in which example embodiments of the inventive concepts are shown. The inventive concepts may, however, be embodied in many different forms and should not be construed as being limited to the embodiments set forth herein; rather these embodiments are provided so that this disclosure will be thorough and complete, and will fully convey the concept of the inventive concepts to one of ordinary skill in the art.

It will be understood that, although the terms first, second, third etc. may be used herein to describe various members, regions, layers, portions, and/or elements, these members, regions, layers, portions, and/or elements should not be limited by these terms. These terms are only used to distinguish one member, region, portion, or element from another member, region, portion, or element. Thus, a first member, region, portion, or element discussed below could be termed a second member, region, portion, or element without departing from the teachings of exemplary embodiments. For example, a first element could be termed a second element, and, similarly, a second element could be termed a first element, without departing from the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

Variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing.

Figure 10A:
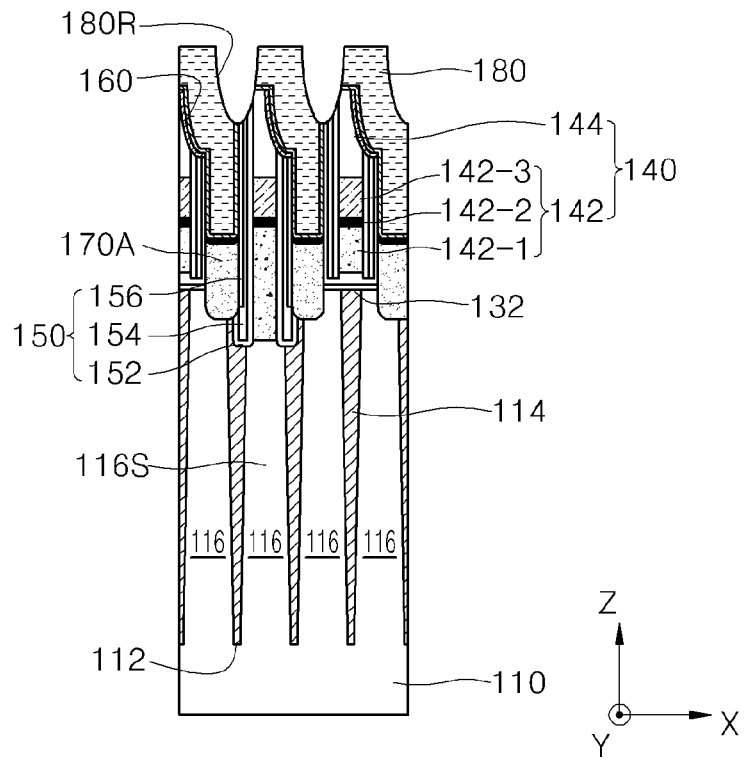
FIGS. 10A through 10D are cross-sectional views illustrating some elements in the cell array region taken along lines A-A', B-B', C-C', and D-D' of FIG. 9, respectively.
Figure 10B:
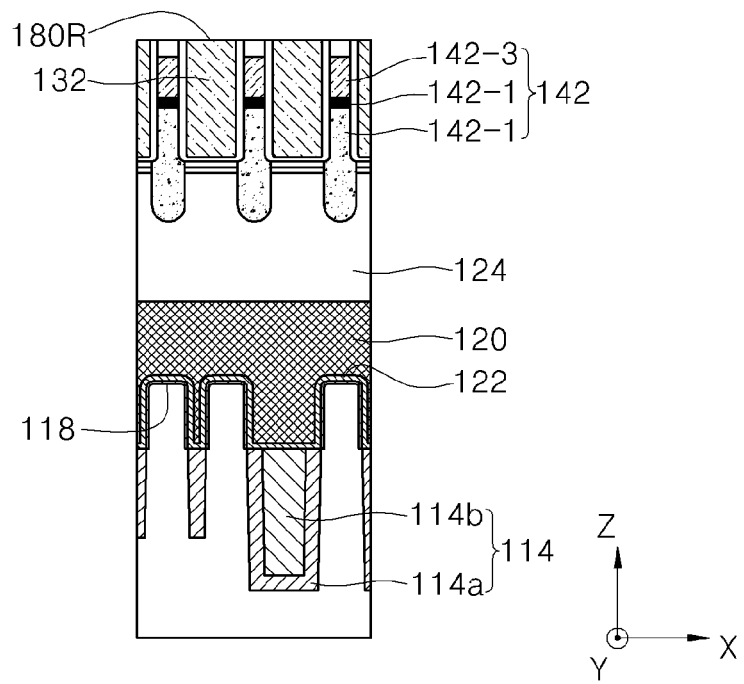
Figure 10C:
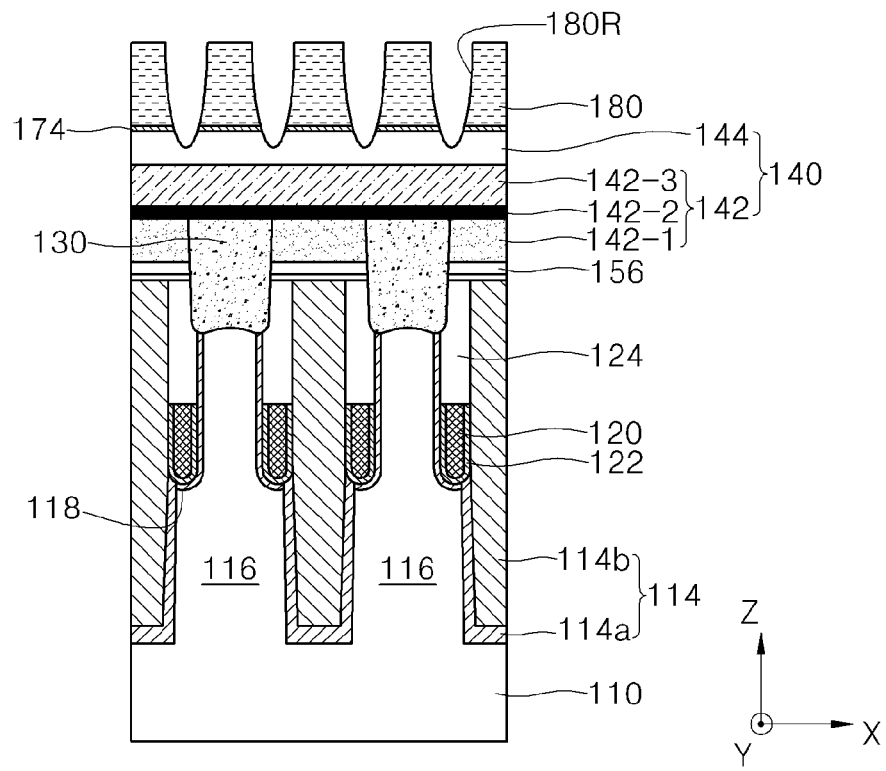
Figure 10D:
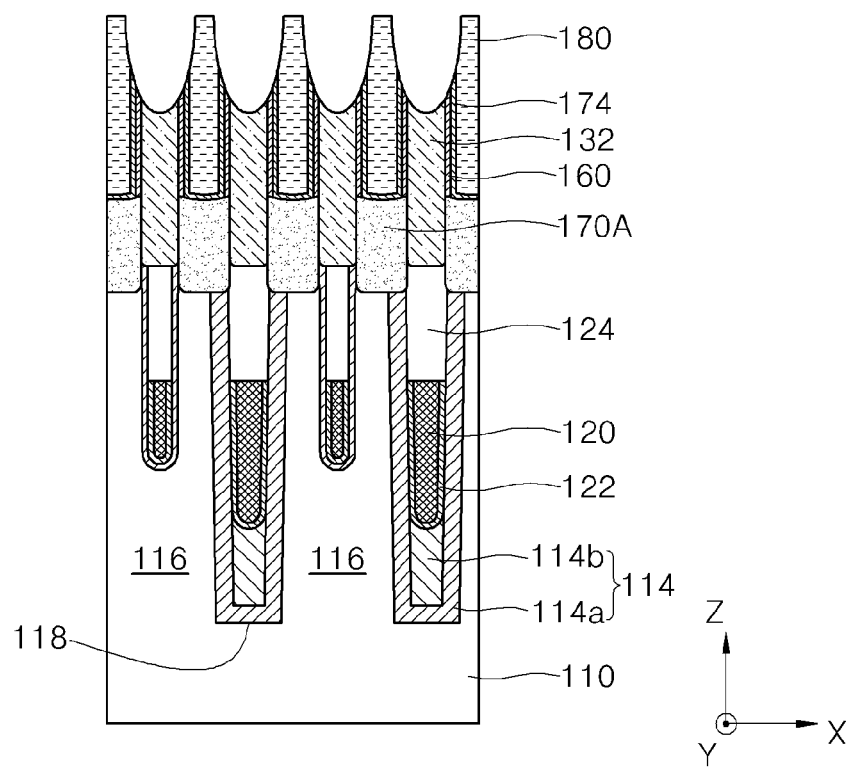
Figure 10E:
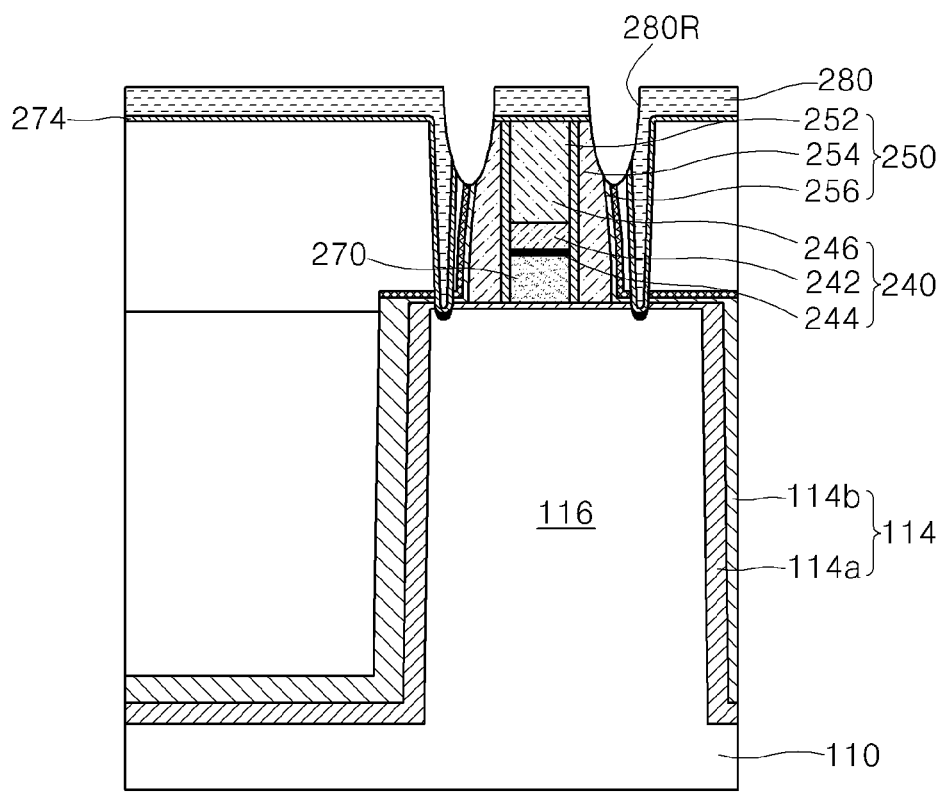
FIG. 10E is a cross-sectional view illustrating some elements in the peripheral region for explaining a method of manufacturing the semiconductor device of FIG. 1, according to some embodiments of the inventive concepts.

FIG. 1 is a cross-sectional view illustrating essential elements of a semiconductor device 100-1, according to an embodiment of the inventive concepts. FIG. 1 illustrates only essential elements of FIG. 10A, and some elements are not shown.

Referring to FIG. 1, the semiconductor device 100-1 includes a substrate 110 having a plurality of active areas 116 that are defined by a device isolation film 114.

The substrate 110 may include silicon (Si), for example, monocrystalline silicon, polycrystalline silicon, or amorphous silicon. In other embodiments, the substrate 110 may include a semiconductor material such as germanium (Ge), silicon germanium (SiGe), silicon carbide (SiC), gallium arsenide (GaAs), indium arsenide (InAs), or indium phosphide (InP). In some embodiments, the substrate 110 may include a conductive region, for example, a well doped with impurities or a structure doped with impurities.

A plurality of conductive lines 142 are formed over the substrate 110 to be spaced apart from the substrate 110 with a first insulating pattern 132 there between. The plurality of conductive lines 142 may extend over the substrate 110 in one direction (Y direction) to be parallel to one another.

In FIG. 1, the plurality of conductive lines 142 may constitute a plurality of bit lines.

The plurality of conductive lines 142 are respectively covered by insulating capping layer 144. The plurality of conductive lines 142 may include a first conductive line 142-1, a second conductive line 142-2, and a third conductive line 142-3. Each of the insulating capping layer 144 may taper such that a width in a first direction (X direction) perpendicular to an upper surface of the substrate 110 decreases from a lower end portion to an upper end portion. One conductive line 142 and one insulating capping layer 144 that covers the one conductive line 142 constitute one conductive line structure 140. A landing pad insulating film 160 that contacts a side surface of an upper portion of the conductive line structure 140 may be formed. Both side surfaces of each of the plurality of conductive line structures 140 are covered by an insulating spacer structure 150. The insulating spacer structure 150 may include a first insulating spacer 152, a second insulating spacer 154, and a third insulating spacer 156. The second insulating spacer 154 that is formed between the first insulating spacer 152 and the third insulating spacer 156 may be an air spacer in which air is filled. Also, an upper portion of the second insulating spacer 154 contacts a bottom surface 160A of the landing pad insulating film 160, and is closed by the bottom surface 160A of the landing pad insulating film 160.

A plurality of contact holes 170H that pass through the first insulating pattern 132 may be formed in the first insulating pattern 132 to expose the plurality of active areas 116. Each of the contact holes 170H is disposed between two adjacent conductive lines 142 from among the plurality of conductive lines 142 and is defined by an insulating spacer structure 150 that covers a side wall of each of the two adjacent conductive lines 142.

A plurality of landing pads 180 that are formed in the contact holes 170H may be formed on the plurality of conductive lines 142.

Each of the contact holes 170H may be formed to have a first width W1 in the first direction (X direction) parallel to the upper surface of the substrate 110. A lower end portion of each of the plurality of landing pads 180 may be formed to have a second width W2 in the first direction (X direction) and an upper end portion of each of the plurality of landing pads 180 may be formed to have a third width W3 in the first direction (X direction). The third width W3 may be greater than the second width W2.

Contacts plug 170 that fill each of the contact holes 170H may be formed between the plurality of conductive lines 142 to be connected to the substrate 110. A metal silicide film 172 may be formed on the contact plug 170.

The plurality of contact plugs 170 are respectively connected to the plurality of active areas 116 of the substrate 110 and extend in the contact holes 170H in a third direction (Z direction) perpendicular to the upper surface of the substrate 110. The contact plug 170 may be electrically connected to at least one of the plurality of active areas 116.

Each of the landing pads 180 may extend upward in the third direction (Z direction) perpendicular to the upper surface of the substrate 110 between the plurality of insulating spacer structures 150 that are formed adjacent to each other about the landing pad 180 to contact the landing pad insulating film 160 and to overlap with an upper portion of the insulating capping layer 144 in the third direction (Z direction).

The landing pad 180 may be connected to the contact plug 170, and the metal silicide film 172 may be formed between the contact plug 170 and the landing pad 180. The metal silicide film 172 may include at least one selected from the group consisting of cobalt silicide ($CoSi_x$), nickel silicide ($NiSi_x$), and manganese silicide ($MnSi_x$).

A barrier film 174 that surrounds the landing pad 180 may be formed to contact the insulating spacer structure 150 that is formed adjacent to both side surfaces of the landing pad 180, the metal silicide film 172, and the landing pad insulating film 160. The barrier film 174 may be formed of a conductive material.

A capacitor lower electrode 190 may be formed on the landing pad 180 to contact the landing pad 180.

Figure 6A:
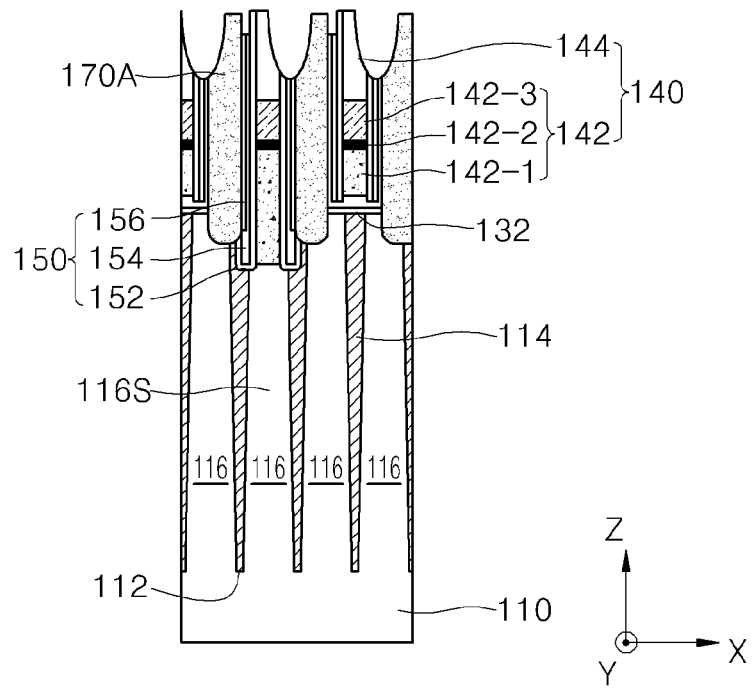
Figure 6B:
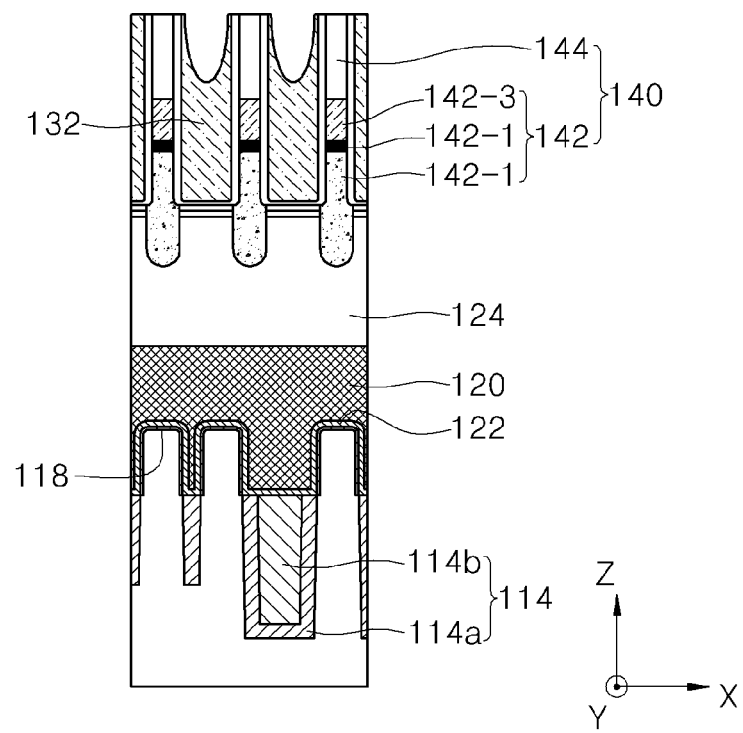
Figure 6C:
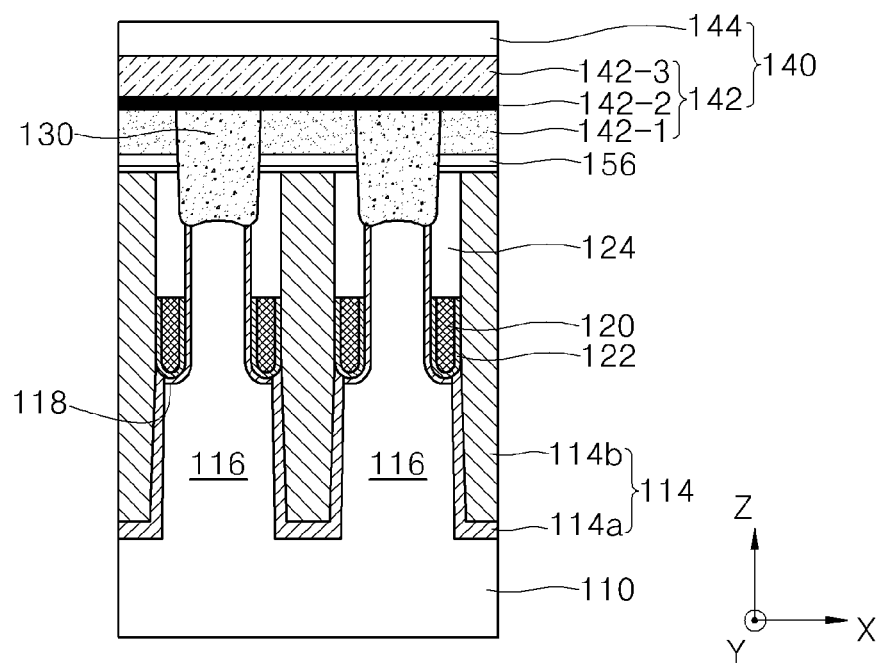
Figure 6D:
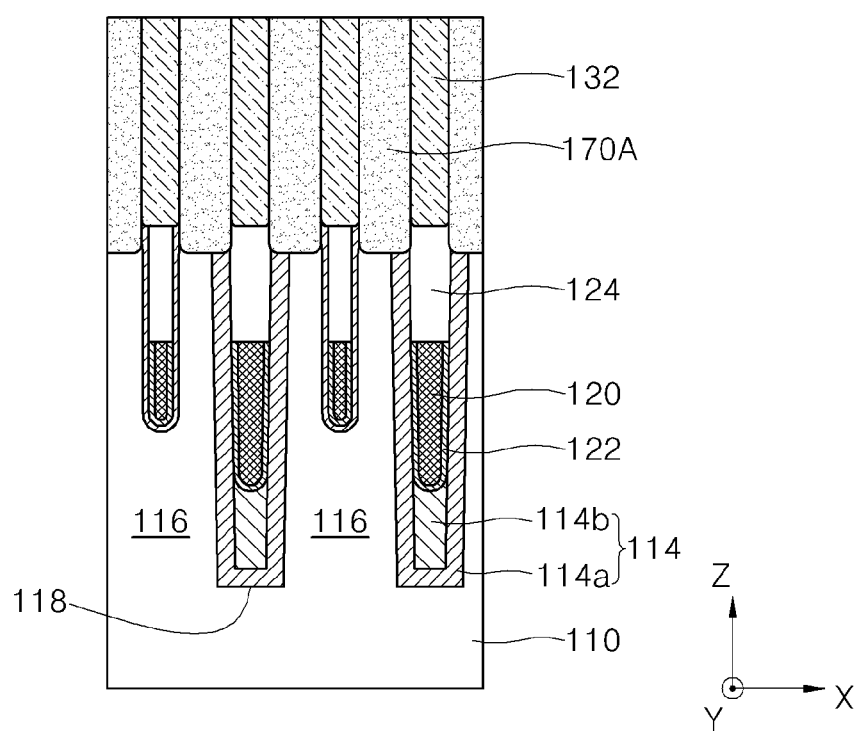
Figure 6E:
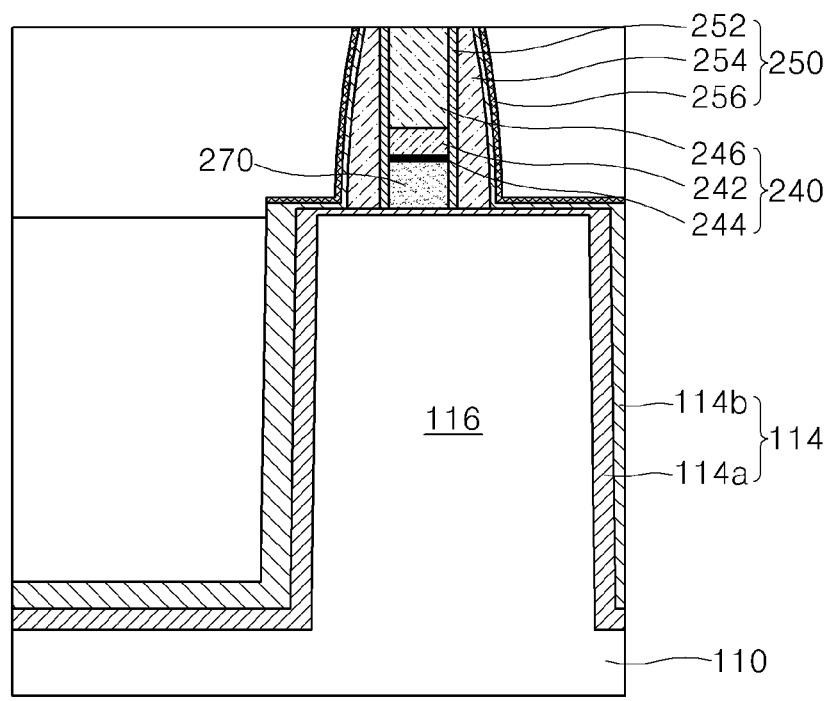
FIGS. 6E, 7E, and 8E are cross-sectional views illustrating some elements in the peripheral region for explaining a method of manufacturing the semiconductor device of FIG. 1, according to some embodiments of the inventive concepts.

The contact plug 170 may be formed between the plurality of conductive lines 142 to have a first width W1 corresponding to a horizontal cross-sectional area of the contact hole 170H in the first direction (X direction). Sizes of widths of an upper end portion and a lower end portion of the landing pad 180 in the first direction (X direction) may be different from each other. The lower end portion of the landing pad 180 may have a second width W2 in the first direction (X direction), and the upper end portion of the landing pad 180 may have a third width W3 in the first direction (X direction). The third width W3 may be greater than the second width W2. A difference Wx between the third width W3 and the second width W2 may correspond to a size including all of a thickness of a portion removed by etching a part of the insulating capping layer 144 (see FIG. 6A), a thickness of the landing pad insulating film 160, a thickness of the insulating spacer structure 150, and a thickness of the barrier film 174.

The semiconductor device 100-1 of FIG. 1 includes the landing pad 180 and the contact plug 170 connected to the plurality of active areas 116 of the substrate 110 in order to electrically connect the plurality of active areas 116 of the substrate 110 to the capacitor lower electrode 190. The landing pad 180 vertically overlaps with the conductive line 142 and extends to cover the upper portion of the conductive line structure 140. The landing pad 180 is electrically connected to the contact plug 170. The metal silicide film 172 may be formed between the contact plug 170 and the landing pad 180. The capacitor lower electrode 190 is connected to the landing pad 180. The landing pad insulating film 160 contacts a side surface of the insulating capping layer 144, and is disposed between the insulating capping layer 144 and an upper portion of the landing pad 180. In this structure, since the upper end portion of the insulating capping layer 144 with which the landing pad 180 overlaps from among one pair of insulating capping layers 144 that are formed adjacent to the landing pad 180 tapers due to a subsequent etching process such that a size of a width decreases from the lower end portion toward the upper end portion, a width of the upper end portion of the landing pad 180 increases and a bridge phenomenon between the landing pads 180 may be mitigated or prevented, thereby improving the reliability of the semiconductor device 100-1.

Figure 2:
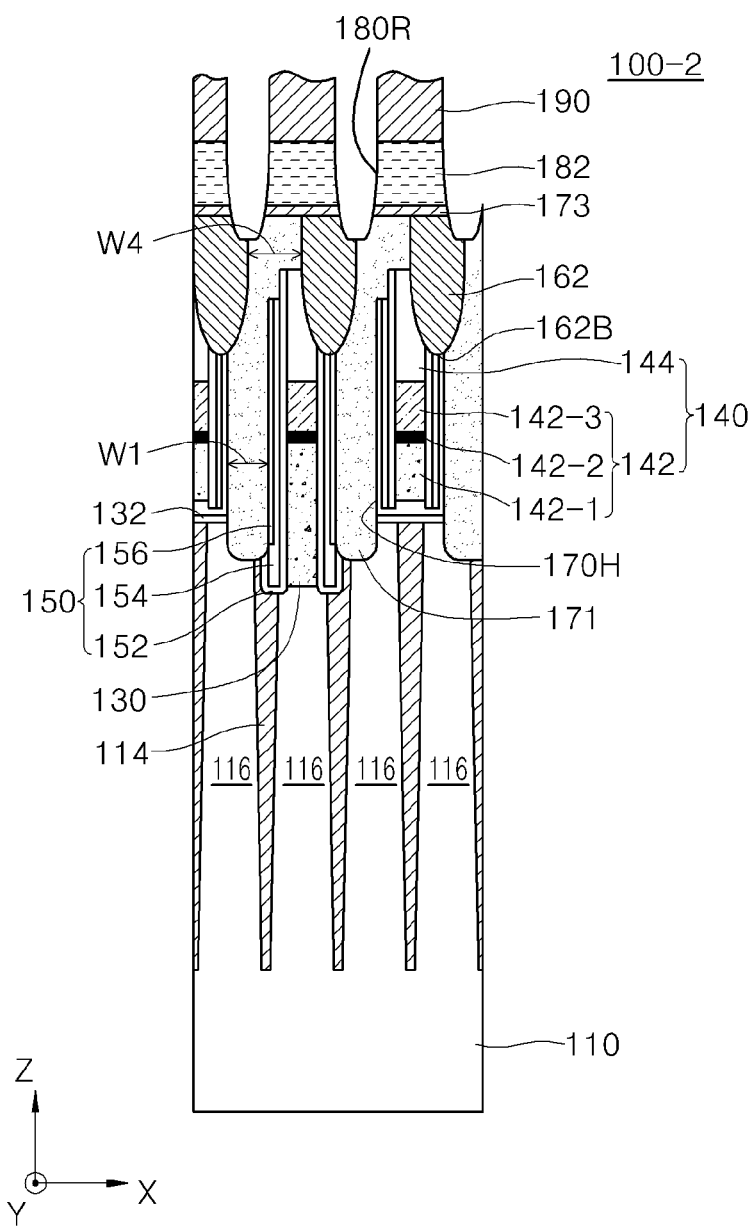
FIG. 2 is a cross-sectional view illustrating primary elements of a semiconductor device, according to another embodiment of the inventive concepts.
Figure 18A:
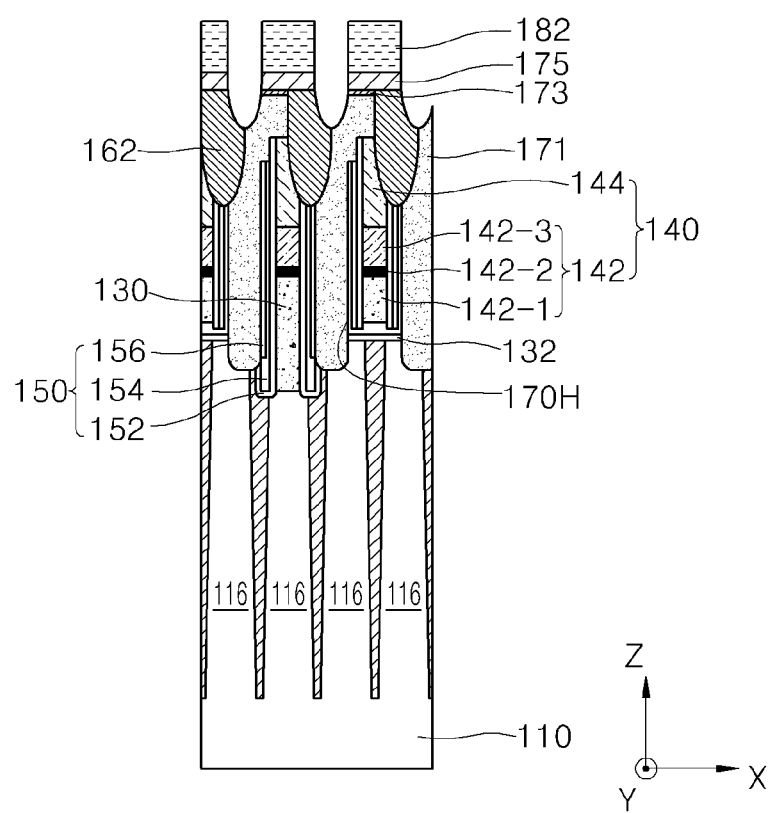
Figure 18B:
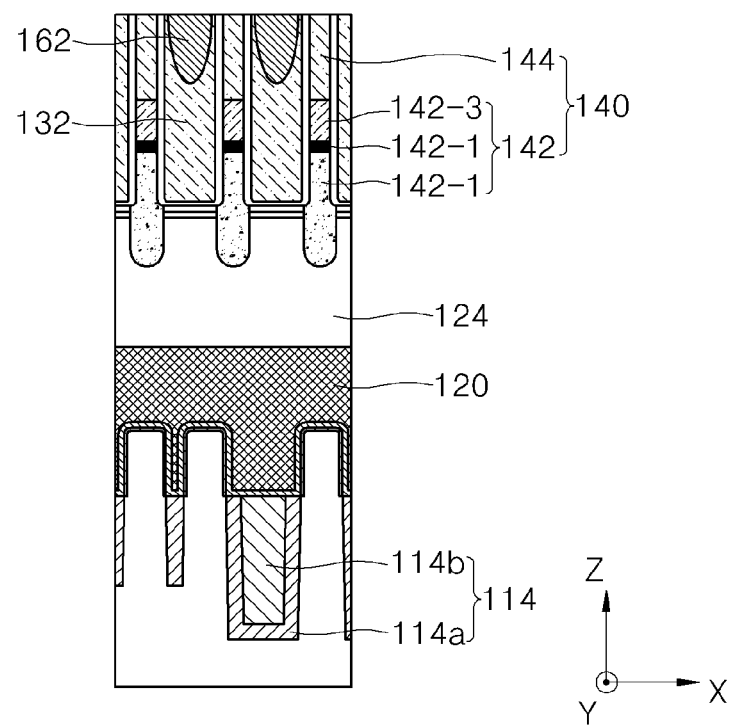
Figure 18C:
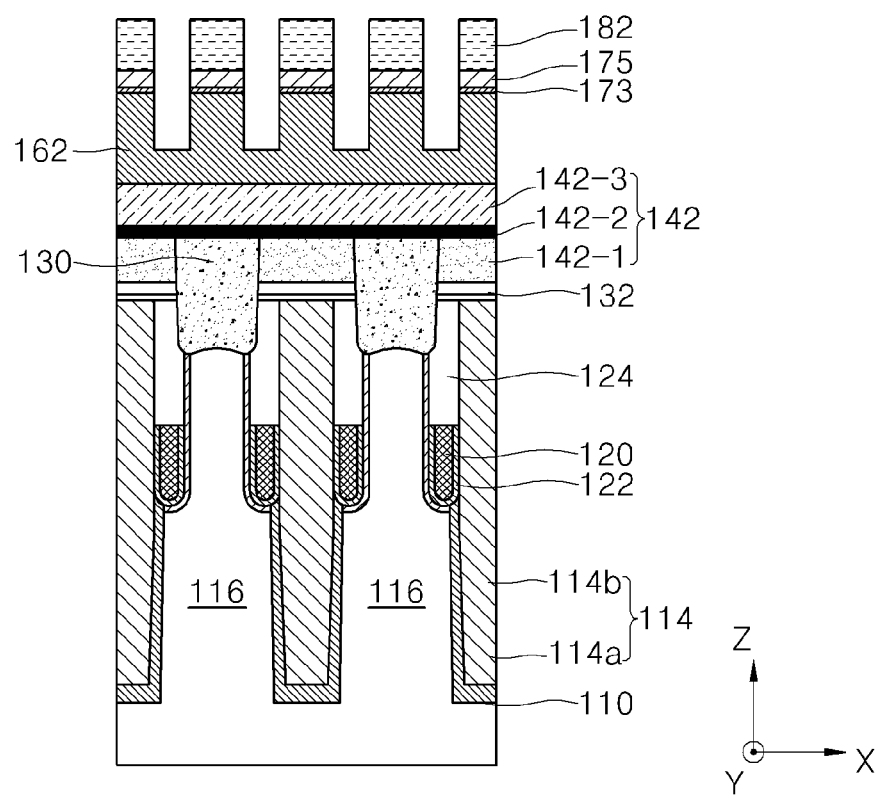
Figure 18D:
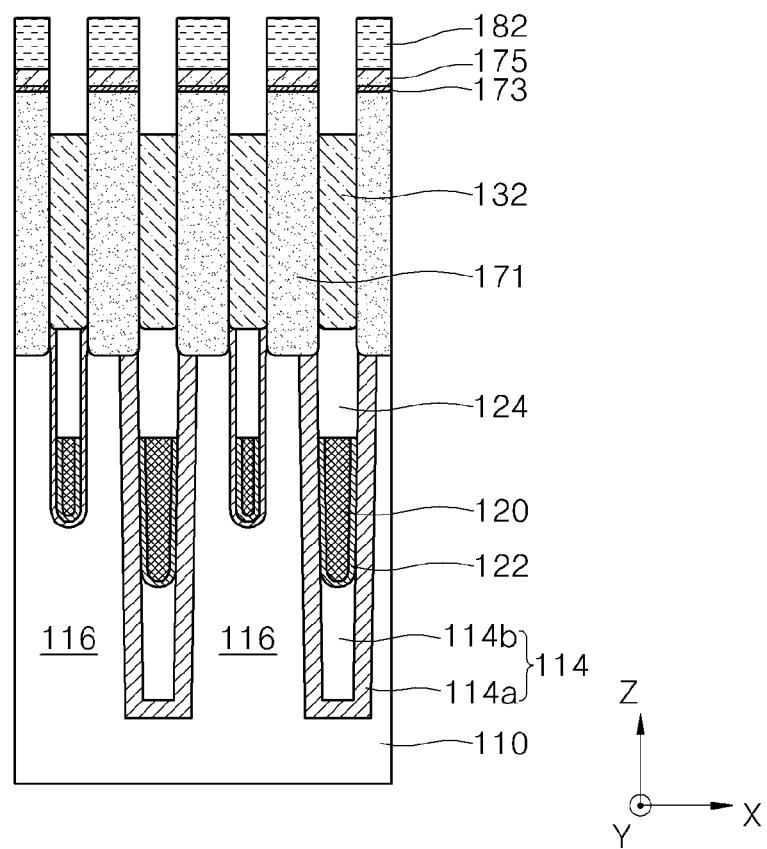
Figure 18E:
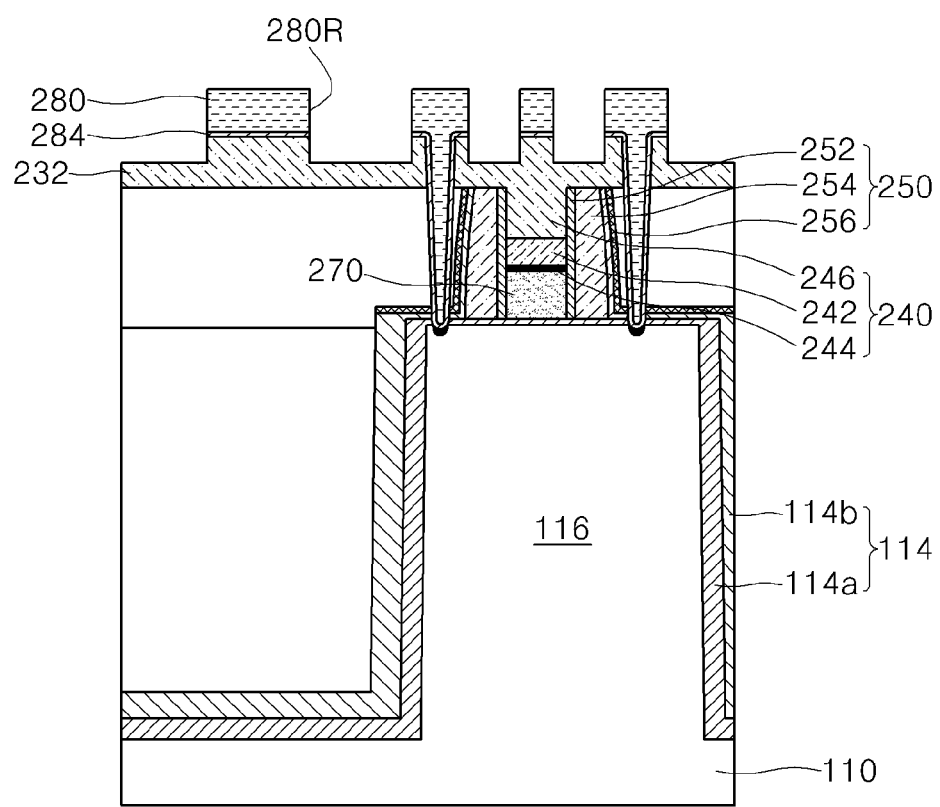

FIG. 2 is a cross-sectional view illustrating primary elements of a semiconductor device 100-2, according to another embodiment of the inventive concepts. FIG. 2 illustrates only essential elements of FIG. 18A, and some elements may not be shown.

The same reference numerals in FIG. 2 as those in FIG. 1 denote the same elements.

The semiconductor device 100-2 may include the substrate 110 that has the plurality of active areas 116, the first insulating pattern 132 that is formed on the substrate 110, the conductive line structure 140, and a second insulating pattern 162 that contacts one side surface of the insulating capping layer 144 of the conductive line structure 140. The semiconductor device 100-1 of FIG. 1 and the semiconductor device 100-2 of FIG. 2 are different in terms of a shape of a contact plug 171, an existence of the second insulating pattern 162, and a shape of a metal silicide film 173. The same elements and operations as those in FIG. 1 will not be repeatedly explained.

The second insulating pattern 162 may be formed to contact the one side surface of the insulating capping layer 144 of the conductive line structure 140. A bottom surface 162B of the second insulating pattern 162 may be formed to contact a top surface of one insulating spacer structure 150 from among one pair of insulating spacer structures 150 that contact both sides of the conductive line structure 140. A landing pad recess 180R may be formed in one side surface of an upper portion of the second insulating pattern 162.

The plurality of contact holes 170H through which the plurality of active areas 116 are exposed may be formed in the first insulating pattern 132. The contact holes 170H are formed between two adjacent conductive lines 142 from among the plurality of conductive lines 142 and are defined by the insulating spacer structures 150 that cover side walls of the two adjacent conductive lines 142. The contact plug 171 is filled in each of the entire contact holes 170H and extends to overlaps with an upper portion of one conductive line structure 140 from among one pair of conductive line structures 140 that are disposed adjacent to the contact hole 170H. The contact plug 171 may be electrically connected to at least one of the plurality of active areas 116.

The contact plug 171 may be formed such that sizes of widths of an upper end portion and a lower end portion in the first direction (X direction) parallel to the upper surface of the substrate 110 are different from each other, unlike the contact plug 170 of FIG. 1. In detail, the lower end portion of the contact plug 171 may have a first width W1 in the first direction (X direction) whereas the upper end portion of the contact plug 171 may have a fourth width W4 in the first direction (X direction). The fourth width W4 refers to a size of a width between the landing pad recess 180R and the second insulating pattern 162 on the insulating capping layer 144 of the conductive line structure 140.

In the semiconductor device 100-2 of FIG. 2, since the upper end portion of the contact plug 171 in the first direction (X direction) parallel to the upper surface of the substrate 110 is formed to have a relatively great width and a landing pad 182 is formed on the contact plug 171 to contact the upper end portion of the contact plug 171, a bridge phenomenon of the landing pad 182 may be mitigated or prevented and resistance characteristics may be improved, thereby improving the reliability of the semiconductor device 100-2. In detail, since the semiconductor device 100-2 further includes the second insulating pattern 162 that contacts the insulating capping layer 144 of the conductive line structure 140, the landing pad recess 180R is formed in the second insulating pattern 162, and the contact plug 171 extends to overlap with an upper portion of the insulating capping layer 144 along the contact hole 170H, the upper end portion of the contact plug 171 may have a fourth width W4 great enough for the landing pad 182 to be connected thereto. Accordingly, a sufficient margin of a width of a position where the landing pad 182 is to be formed may be provided during a process of manufacturing the landing pad 182, thereby reducing a failure rate. Also, erosion of a metal silicide film 173 which may occur during a process of forming the metal silicide film 173 in a manufacturing process (see FIGS. 16A through 16D) may be mitigated or prevented.

Figure 3:
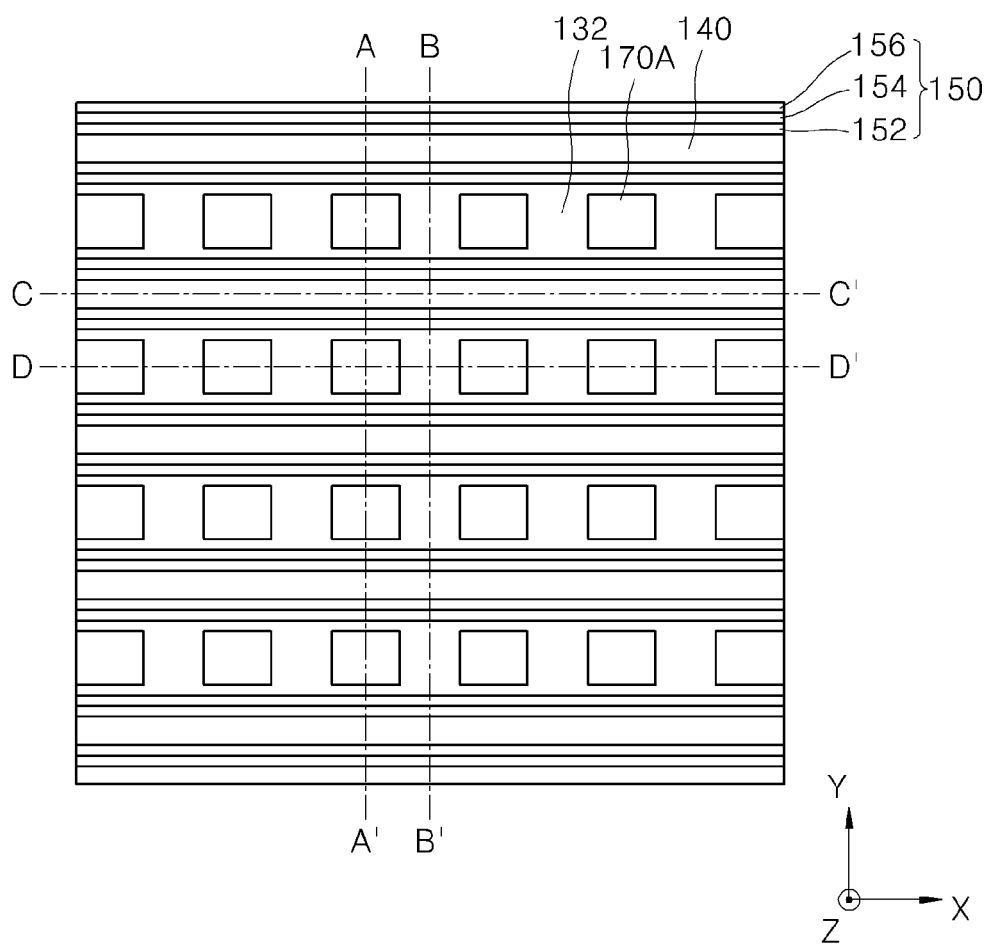
FIG. 3 is a plan layout illustrating some elements in a cell array region for explaining a method of the semiconductor device of FIG. 1, according to some embodiments of the inventive concepts.

FIG. 3 is a plan layout illustrating a cell array region of the semiconductor device 100-1, according to an embodiment of the inventive concepts. FIGS. 4A through 4D are cross-sectional views illustrating some elements in the cell array region of the semiconductor device 100-1 of FIG. 3.

The plan layout of FIG. 3 may be applied to, for example, a memory cell having a unit cell size of 6 $F^2$ in a semiconductor memory device. Here, F is a minimum lithographic feature size.

Referring to FIG. 3, the semiconductor device 100-1 includes the plurality of conductive line structures 140. The plurality of conductive line structures 140 extend to be parallel to one another in the first direction (X direction of FIG. 3). The plurality of conductive line structures 140 may be arranged at regular intervals. In FIG. 3, the plurality of conductive line structures 140 may be arranged to be parallel to one another with a pitch of 3 F. The insulating spacer structures 150 are formed to contact both side surfaces of each of the conductive line structure 140.

Figure 7A:
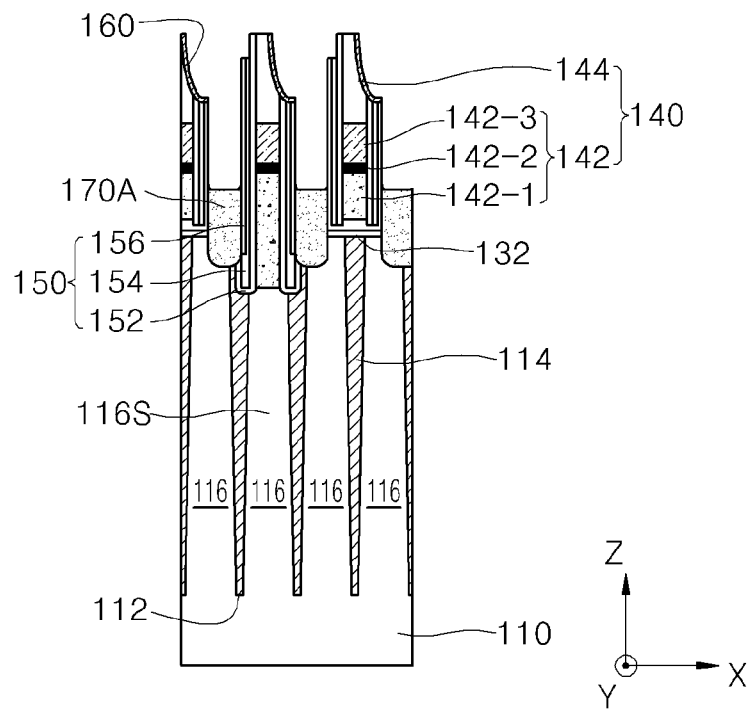
Figure 7B:
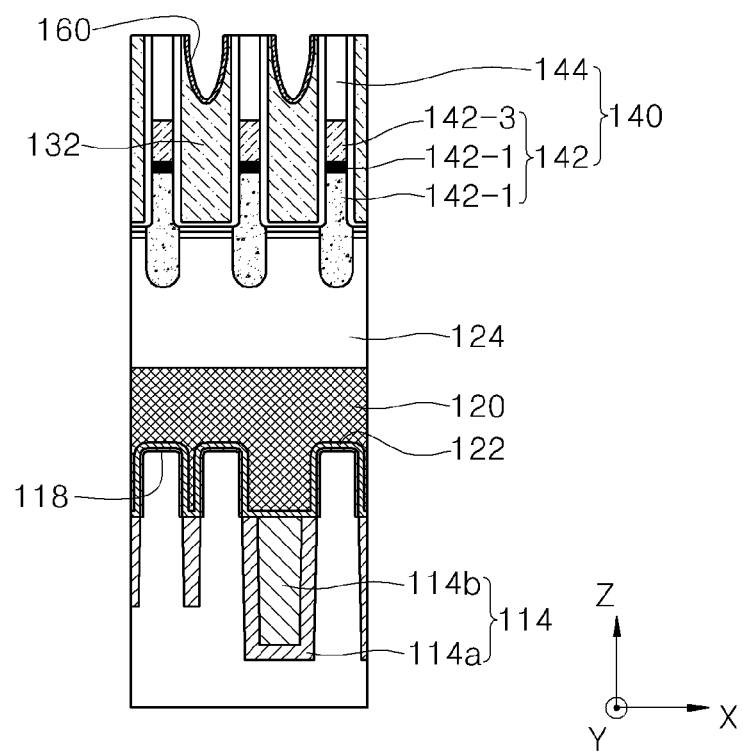
Figure 7C:
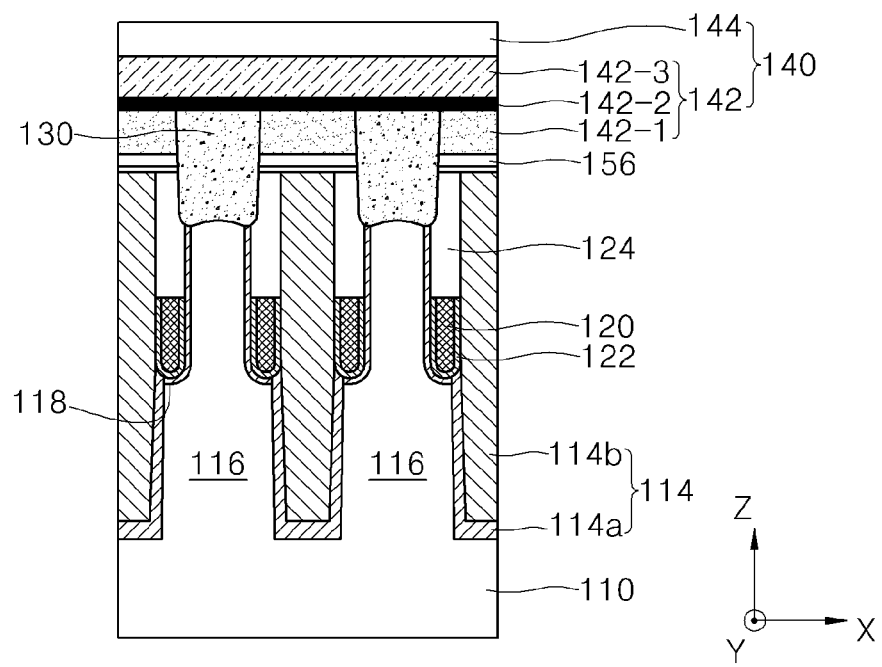
Figure 7D:
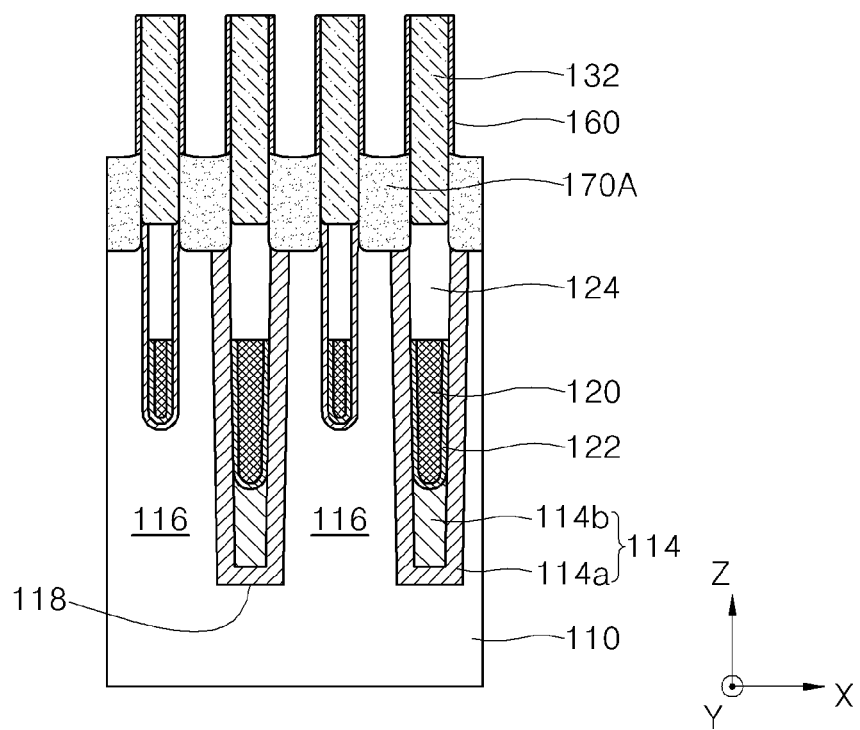
Figure 7E:
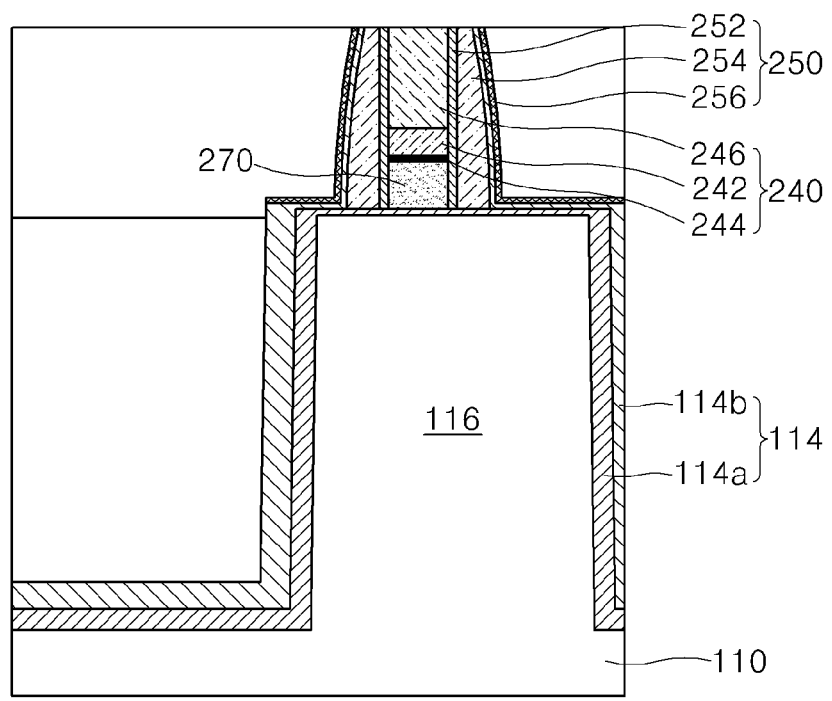
Figure 8A:
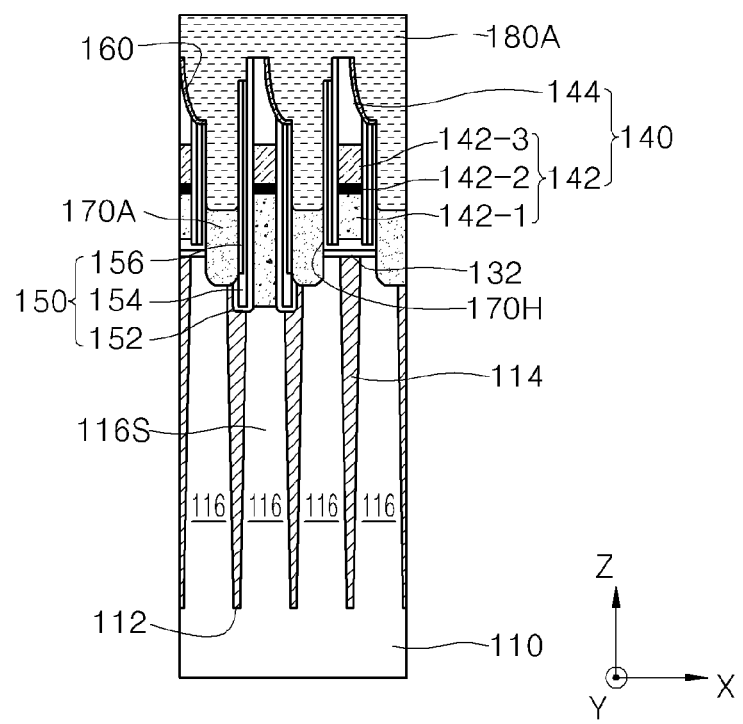
Figure 8B:
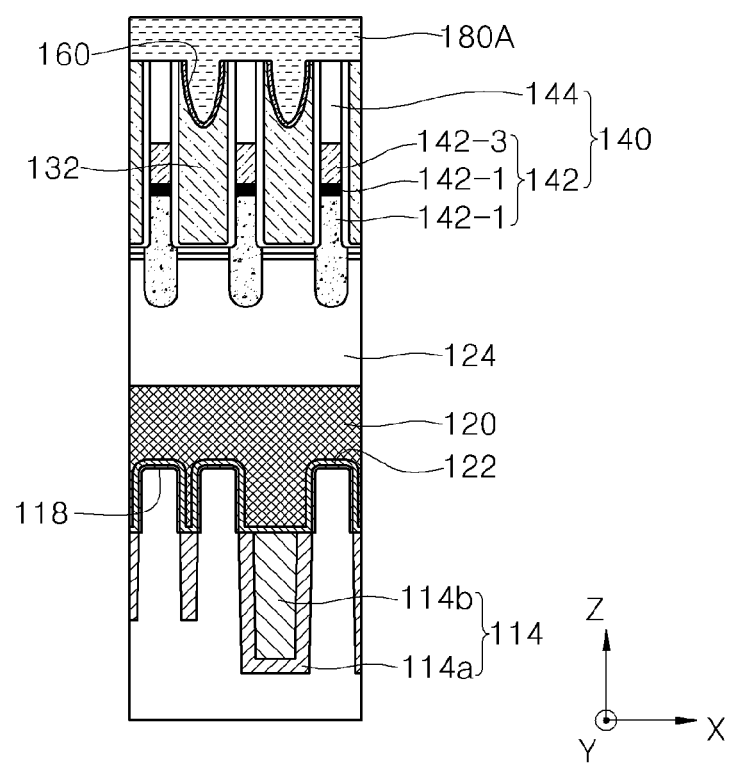
Figure 8C:
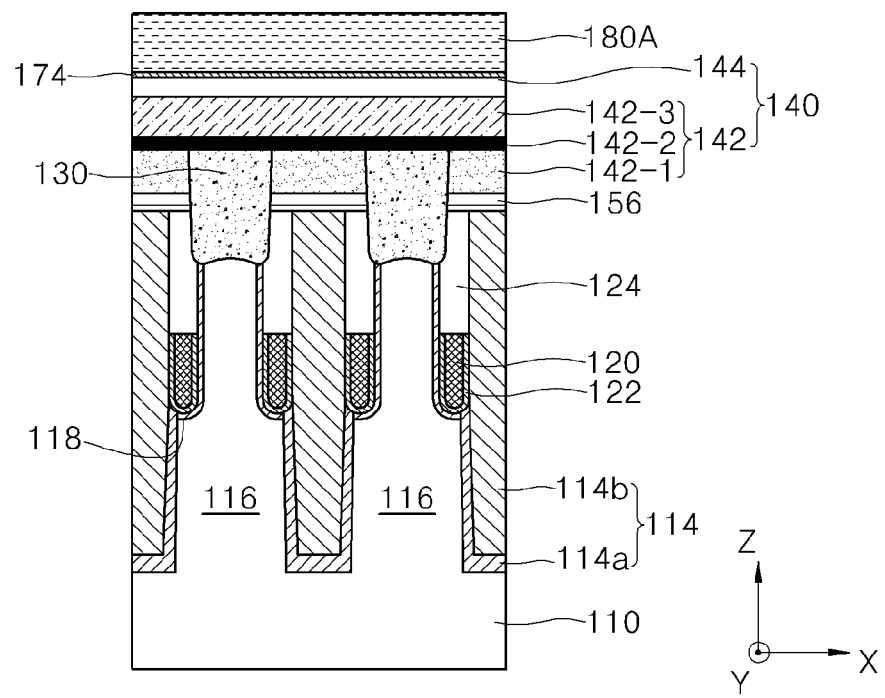
Figure 8D:
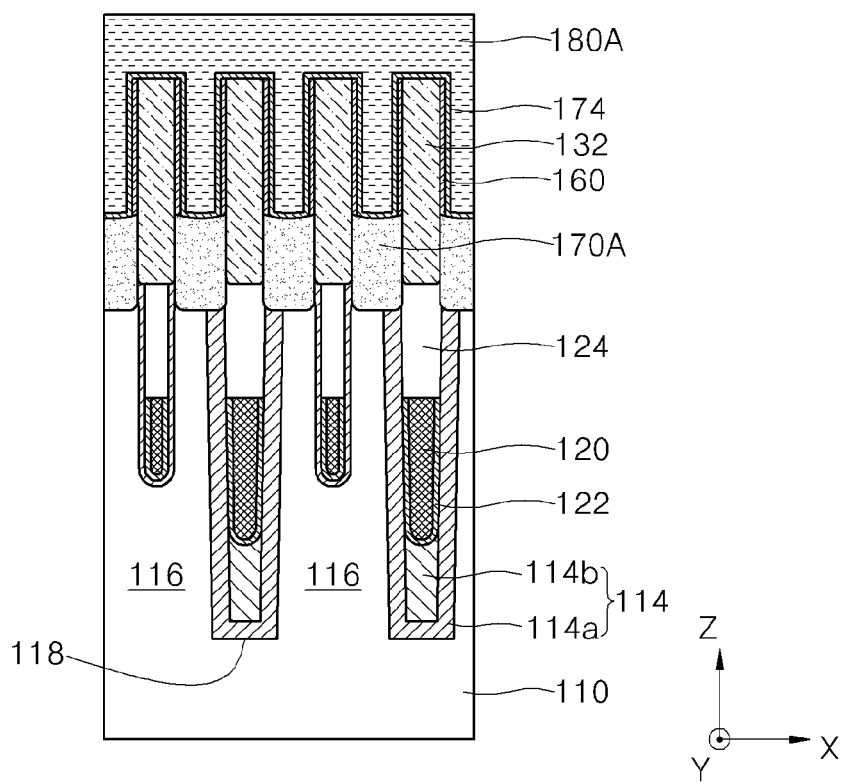
Figure 8E:
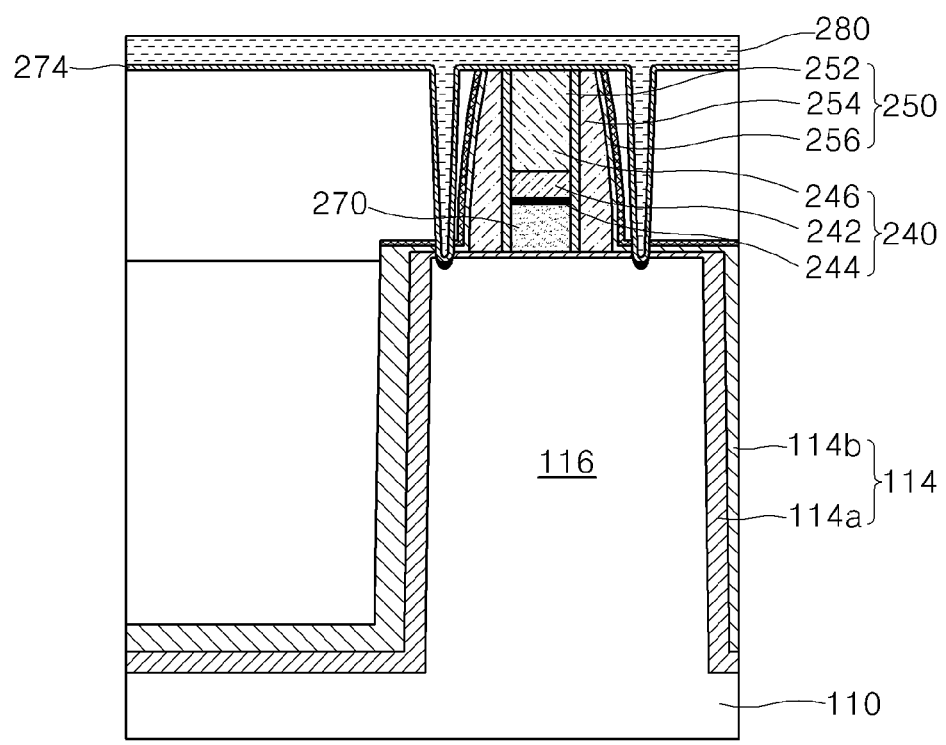

A plurality of contact forming conductive layers 170A are formed between the plurality of conductive line structures 140. The plurality of contact forming conductive layers 170A may be configured as contact structures each of which extends from an area between two adjacent conductive lines 142 (see FIG. 1) of the plurality of conductive line structures 140 to an upper portion of any one of the two adjacent conductive lines 142. In some embodiments, the plurality of contact forming conductive layers 170A may be arranged in island shapes to be spaced apart by a predetermined distance in the first direction (X direction of FIG. 3) and a second direction (Y direction of FIG. 3). In some embodiments, the plurality of contact forming conductive layers 170A may be arranged at regular intervals in the second direction (Y direction of FIG. 3). Each of the plurality of contact forming conductive layers 170A may function to electrically connect the capacitor lower electrode 190 (see FIG. 1) to the plurality of active areas 116 (see FIG. 1). The contact forming conductive layers 170A may be separated from one another due to the first insulating pattern 132. The contact forming conductive layers 170A may become the contact plugs 170 (see FIG. 7A) in a subsequent process.

Figure 4A:
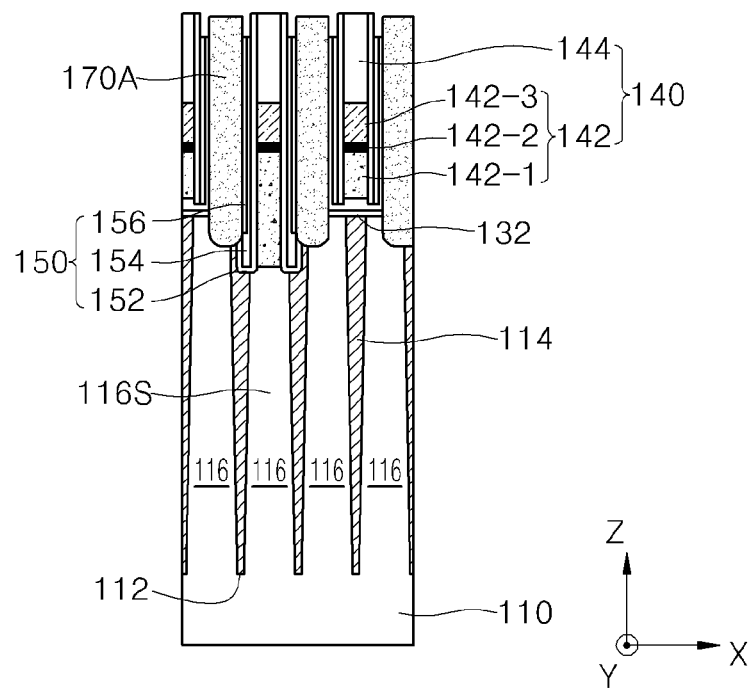
FIGS. 4A through 4D are cross-sectional views illustrating some elements in the cell array region taken along lines A-A', B-B', C-C', and D-D' of FIG. 3, respectively.
Figure 4B:
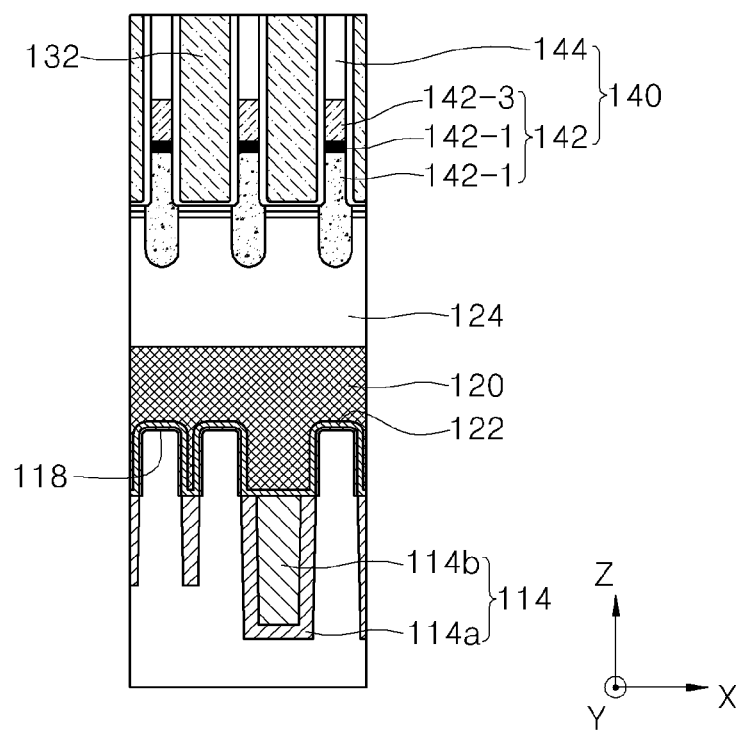
Figure 4C:
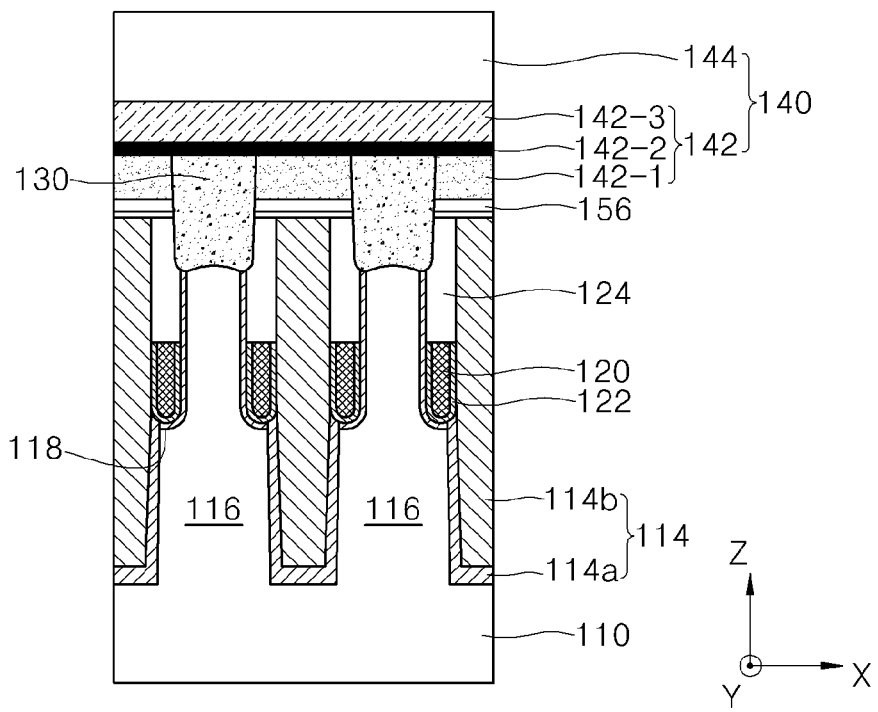
Figure 4D:
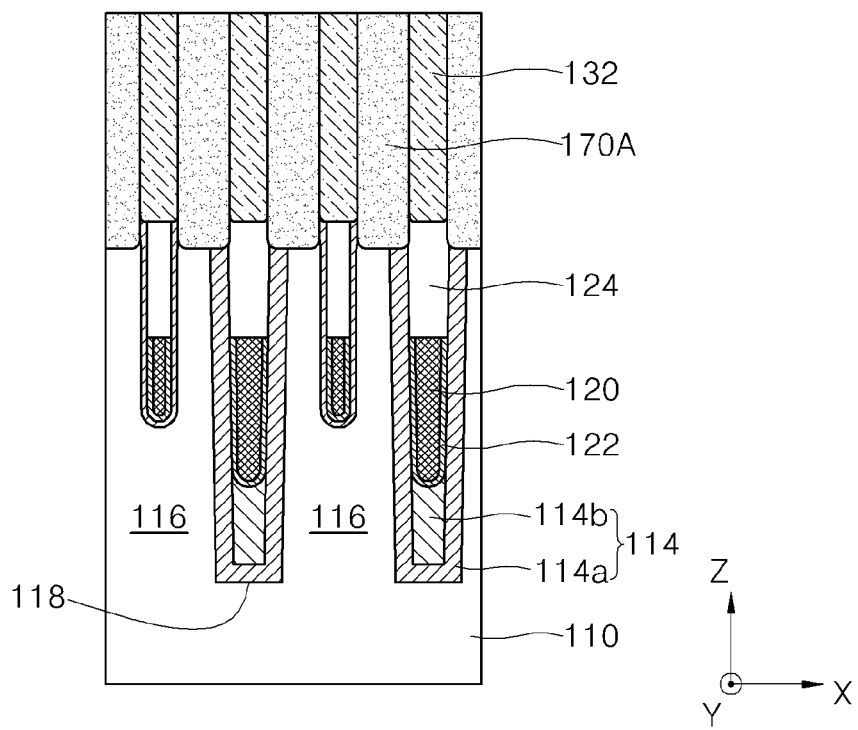
Figure 4E:
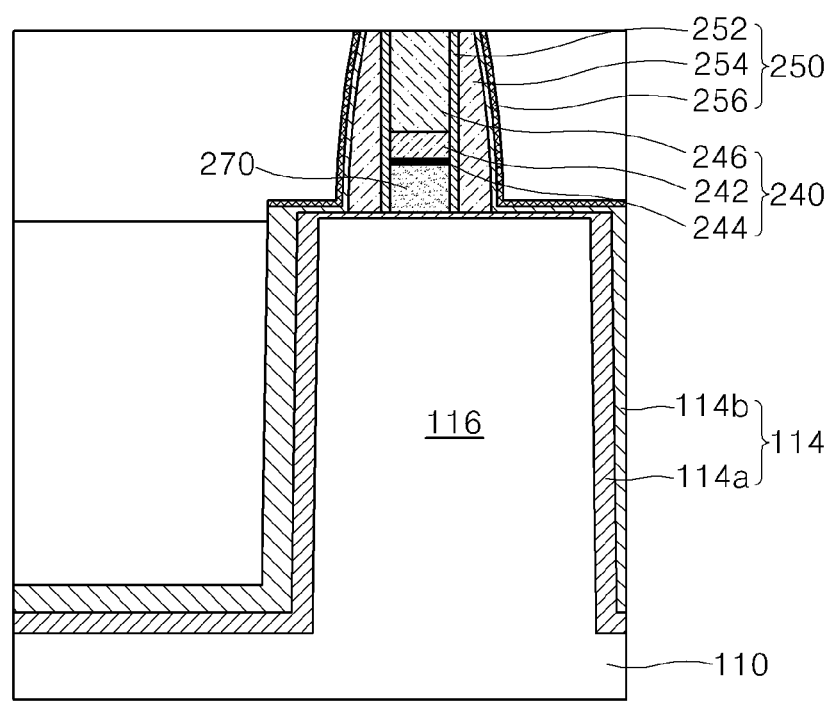
FIG. 4E is a cross-sectional view illustrating some elements in a peripheral region for explaining a method of manufacturing the semiconductor device, according to some embodiments of the inventive concepts.

FIG. 4A is a cross-sectional view taken along line A-A' of FIG. 3. FIG. 4B is a cross-sectional view taken along line B-B' of FIG. 3. FIG. 4C is a cross-sectional view taken along line C-C' of FIG. 3. FIG. 4D is a cross-sectional view taken along line D-D' of FIG. 3. Referring to FIGS. 4A through 4D, device isolating trenches 112 are formed in the substrate 110, and the device isolation film 114 is formed in each of the device isolating trenches 112. The plurality of a plurality of active areas 116 are defined in the substrate 110 due to the device isolation film 114. The substrate 110 has already been explained in detail with reference 1, and thus a repeated explanation thereof will not be given.

The device isolation film 114 may include a first insulating film 114a and a second insulating film 114b. The first insulating film 114a and the second insulating film 114b may be formed of different materials. For example, the first insulating film 114a may be an oxide film, and the second insulating film 114b may be a nitride film. However, the device isolation film 114 of the present embodiment is not limited thereto. For example, the device isolation film 114 may be configured to have a single-layer structure formed of one type insulating film, or a multi-layer structure formed of at least three types of insulating films.

A plurality of word line trenches 118 are formed in the substrate 110. The plurality of word line trenches 118 may extend to be parallel to one another, and may each have a linear shape that crosses the plurality of active areas 116.

As shown in FIG. 4B, in order to form the plurality of word line trenches 118 that have bottom surfaces with stepped portions, the device isolation film 114 and the substrate 110 may be etched by using different etching processes to make an etching depth of the device isolation film 114 different from an etching depth of the substrate 110.

A resultant structure including the plurality of word line trenches 118 is washed, and then a plurality of gate dielectric films 122, a plurality of word lines 120, and a plurality of buried insulating films 124 are sequentially formed in the plurality of word line trenches 118.

In some embodiments, after the word lines 120 are formed, source/drain regions may be formed on top surfaces of the plurality of a plurality of active areas 116 by injecting impurity ions into the substrate 110 at both sides of the word lines 120. In other embodiments, before the plurality of word lines 120 are formed, a process of injecting impurity ions for forming the source/drain regions may be performed. In FIGS. 4A through 4D, the plurality of word lines 120 may be formed of at least one material selected from the group consisting of titanium (Ti), TiN, tantalum (Ta), TaN, tungsten (W), WN, TiSiN, and WSiN.

Each of the gate dielectric films 122 may be at least one selected from the group consisting of a silicon oxide film, a silicon nitride film, a silicon oxynitride film, an oxide/nitride/oxide (ONO) film, and a high-k dielectric film having a dielectric constant higher than that of a silicon oxide film. For example, the gate dielectric film 122 may have a dielectric constant ranging from about 10 to about 25. In some embodiments, the gate dielectric film 122 is formed of at least one material selected from the group consisting of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric film 122 may be formed of $HfO_2$, $Al_2O_3$, $HfAlO_3$, $Ta_2O_3$, or $TiO_2$.

Top surfaces of the plurality of buried insulating films 124 may be substantially at the same level as that of a top surface of the substrate 110. Each of the buried insulating films 124 may be one material film selected from the group consisting of a silicon oxide film, a silicon nitride film, a silicon oxynitride film, and a combination thereof.

The first insulating pattern 132 is formed on the substrate 110. The first insulating pattern 132 may be formed to have a thickness ranging from about 200 Å to about 400 Å. The first insulating pattern 132 may include silicon oxide. For example, the first insulating pattern 132 may be formed of at least one insulating material selected from the group consisting of tetraethyl orthosilicate (TEOS), high density plasma (HDP), and borophosphosilicate glass (BPSG).

A plurality of direct contacts 130 each formed of a conductive material are formed in portions of the plurality of a plurality of active areas 116 through which a plurality of source regions 116S are exposed. The direct contacts 130 are electrically connected to the source regions 116S of the plurality of active areas 116.

The plurality of conductive line structures 140 that extend to be parallel to one another are formed on the plurality of direct contacts 130 and the first insulating pattern 132. The plurality of conductive line structures 140 include the plurality of conductive lines 142, and the plurality of insulating capping layers 144 that cover top surfaces of the plurality of conductive lines 142. The plurality of conductive lines 142 may be electrically connected to the plurality of direct contacts 130.

In some embodiments, each of the plurality of conductive lines 142 may include at least one material selected from the group consisting of a semiconductor, a metal, conductive metal nitride, and metal silicide which are doped with impurities. The conductive lines 142 may be formed to have a three-layer stacked structure including a first conductive line 142-1, a second conductive line 142-2, and a third conductive line 142-3. However, the present embodiment is not limited thereto, and the conductive lines 142 may be formed to have a single-layer structure, a two-layer structure, or a multi-layer structure including three or more layers.

In FIGS. 4A through 4D, the first conductive line 142-1 may be formed of doped polysilicon, the second conductive line 142-2 may be formed of TiN, and the third conductive line 142-3 may be formed of tungsten (W).

Each of the plurality of insulating capping layers 144 may include at least one insulating film selected from the group consisting of a silicon oxide film, a silicon nitride film, and a combination thereof. In FIGS. 4A through 4D, each of the plurality of insulating capping layers 144 includes a silicon nitride film formed of $Si_3N_4$. A thickness of each of the plurality of insulating capping layer 144 may be greater than a thickness of each of the plurality of conductive lines 142.

In some embodiments, in order to form the plurality of conductive line structures 140, a conductive line forming material layer that is a conductive layer is formed on the first insulating pattern 132, and an insulating layer that covers the conductive layer is formed. A thickness of the insulating layer may be greater than a thickness of the conductive line forming material layer. The plurality of insulating capping layers 144 are formed by patterning the insulating layer, and then the plurality of conductive lines 142 are formed by etching the conductive line forming material layer by using the plurality of insulating capping layers 144 as an etching mask.

Both side walls of the plurality of conductive line structures 140 are covered by the insulating spacer structures 150. Each of the insulating spacer structure 150 may include at least one insulating film selected from the group consisting of a silicon oxide film, a silicon nitride film, and a combination thereof. Although the insulating spacer structure 150 has a three-layer structure in FIGS. 4A through 4D, the present embodiment is not limited thereto and the insulating spacer structure 150 may have a single-layer structure, a two-layer structure or a multi-layer structure including three or more layers.

The contact holes 170H are formed between the plurality of conductive line structures 140 and are defined by the insulating spacer structures 150 in the first direction (X direction) parallel to the upper surface of the substrate 110, and the contact forming conductive layers 170A are filled in the contact holes 170H. The contact forming conductive layers 170A may be filled in the contact holes 170H by using chemical vapor deposition (CVD), physical vapor deposition (PVD), or silicon epitaxial growth. Each of the contact forming conductive layers 170A may be formed of at least one conductive material selected from a semiconductor material, a metal, conductive metal nitride, and metal silicide which are doped with impurities. In FIGS. 4A through 4D, the contact forming conductive layer 170A may be formed of doped polysilicon. The contact forming conductive layer 170A is connected to the plurality of active areas 116 of the substrate 110 to form the contact plug 170 (see FIG. 7A) in a subsequent process. A level of an uppermost end of the contact forming conductive layer 170A may be substantially the same as a level of an uppermost end of each of the plurality of conductive line structures 140.

Figure 5:
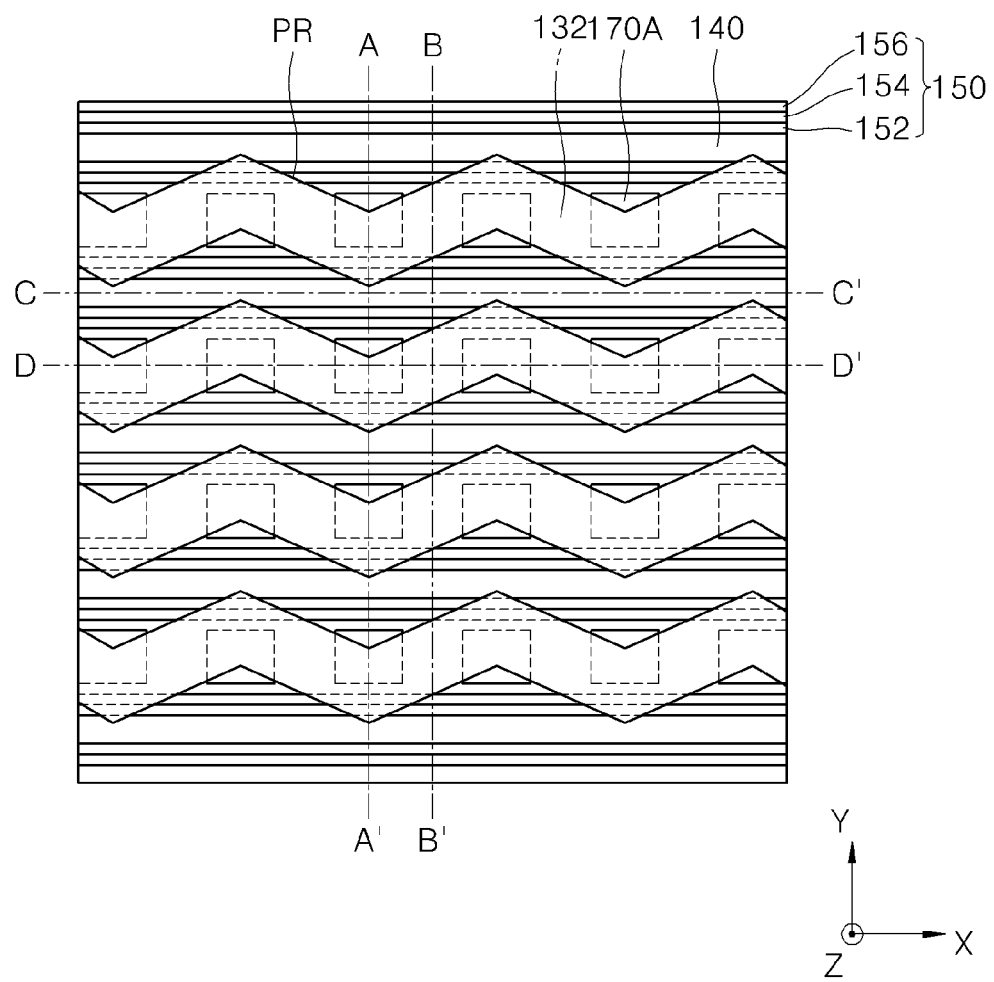
FIG. 5 is a plan layout illustrating some elements in a cell array region for explaining a method of manufacturing the semiconductor device of FIG. 1, according to some embodiments of the inventive concepts.

Referring to FIG. 5, and FIGS. 6A through 6D, an etching mask is formed in a cell array region, and a portion other than a portion covered by the etching mask pattern PR is etched. The etching mask pattern PR that is a separate layer is patterned in the cell array region in order to have a wave shape as shown in FIG. 5 by using an exposure process and an etching process. A plurality of the etching mask patterns PR are formed to be parallel to one another in the first direction (X direction) to alternately contact portions of the insulating spacer structure 150 and the conductive line structure 140 that are formed over the contact forming conductive layer 170A in the second direction (Y direction of FIG. 5) and portions of the insulating spacer structure 150 and the conductive line structure 140 that are formed under the contact forming conductive layer 170A in the second direction (Y direction). That is, each of the etching mask patterns PR is formed to cover portions of the insulating spacer structure 150 and the insulating capping layer 144 that are formed over one contact forming conductive layer 170A in the second direction (Y direction) and to cover portions of the insulating spacer structure 150 and the insulating capping layer 144 that are formed in the second direction (Y direction) under the contact forming conductive layer 170A that is disposed adjacent to the one contact forming conductive layer 170A in the first direction (X direction). Also, the etching mask pattern PR is formed not to completely cover a top surface of the contact plug 170.

Referring to FIGS. 6A through 6D, a portion of the insulating capping layer 144, a portion of the insulating spacer structure 150, and a portion of the contact forming conductive layer 170A are removed from a resultant structure including the etching mask pattern PR by being etched by using the etching mask pattern PR. Since the etching mask pattern PR is formed to alternately cover the insulating capping layer 144 and the insulating spacer structure 150 in the second direction (Y direction) with respect to the contact forming conductive layer 170A (see FIG. 5), FIGS. 6A through 6D illustrate that only upper portions of one side surfaces of the insulating spacer structure 150 and the insulating capping layer 144 are removed by being etched. A top surface of the insulating spacer structure 150 may be exposed during the etching process.

After the etching process, the etching mask pattern PR is removed. The etching mask pattern PR may be removed by using an ashing process and a stripping process.

Referring to FIGS. 7A through 7D, the contact plug 170 is formed by performing an etch-back process on the contact forming conductive layer 170A, and the landing pad insulating film 160 is additionally formed.

The contact plug 170 is formed by reducing a stepped portion by selectively etching only the contact forming conductive layer 170A by using an etch-back process having an etching selectivity with respect to a conductive material. Since upper portions of one pair of conductive line structures 140 that are disposed adjacent to both sides of the contact forming conductive layer 170A include the insulating capping layers 144, when a method using an etching selectivity is performed such that an insulating layer is not etched and only a conductive layer is etched, heights of the insulating capping layers 144 may be maintained.

Next, the landing pad insulating film 160 is additionally formed on an upper portion of one side surface of the insulating capping layer 144 and an upper portion of one side surface of the insulating spacer structure 150 by using the etching process of FIGS. 6A through 6D. The landing pad insulating film 160 is formed to conformally contact an etched portion of the insulating capping layer 144 in order to more widely define a width of an upper portion of the landing pad 180 (see FIG. 10A). The landing pad insulating film 160 may be at least one insulating film selected from the group consisting of a silicon oxide film, a silicon nitride film, and a combination thereof. In FIGS. 7A through 7D, the landing pad insulating film 160 may be a silicon nitride film.

Referring to FIGS. 8A through 8D, the metal silicide film 172 is formed on an exposed surface of a top surface of the contact plug 170, the barrier film 174 that covers a top surface of the metal silicide film 172, a side surface of the landing pad insulating film 160, and a side surface of the insulating spacer structure 150 is formed, and a landing pad forming material 180A that covers an upper portion of the conductive line structure 140 and a space in the contact hole 170H defined by the barrier film 174 is formed.

The metal silicide film 172 may include at least one selected from the group consisting of cobalt silicide ($CoSi_x$), nickel silicide ($NiSi_x$), and manganese silicide ($MnSi_x$). The metal silicide film 172 may be formed of cobalt silicide ($CoSi_x$) in FIGS. 8A through 8D. However, the metal silicide film 172 is not limited thereto.

In some embodiments, the following processes may be performed in order to form the metal silicide film 172. First, a metal layer is deposited on the exposed surface of the top surface of each of the plurality of contact plugs 170, and then is silicidated by performing a first rapid thermal processing (RTP) process. The first RTP process may be performed at a temperature ranging from about 450° C. to about 550° C. In the first RTP process, the metal layer that does not react with silicon (Si) atoms is removed, and then the metal silicide film 172 is formed by performing a second RTP process at a temperature ranging from, for example, about 800° C. to about 950° C., which is higher than the temperature of the first RTP process. In some embodiments, a cobalt (Co) layer may be formed as the metal layer, and the metal silicide film 172 formed of cobalt silicide may be formed. In other embodiments, a process of forming the metal silicide film 172 may be omitted.

After the metal silicide film 172 is formed, the barrier film 174 that covers the side surface of the landing pad insulating film 160 and the side surface of the insulating spacer structure 150 may be formed. The barrier film 174 may be selectively formed on the top surface of the metal silicide film 172. The barrier film 174 may be formed of a conductive material including a metal material. In FIGS. 8A through 8D, the barrier film 174 may be formed to have a Ti/TiN stacked structure.

The landing pad forming material 180A is filled in the space defined by the barrier film 174 and the upper portion of the conductive line structure 140. The landing pad forming material 180A may be formed by using CVD or PVD. The landing pad forming material 180A may be formed of a conductive material such as a metal, a metal compound, or polysilicon. In FIGS. 8A through 8D, the landing pad forming material 180A may be formed of tungsten (W).

The landing pad forming material 180A extends to fill the space defined by the barrier film 174 in the contact hole 170H and to cover the conductive line structure 140 and the landing pad insulating film 160 in the third direction (Z direction) perpendicular to the upper surface of the substrate 110. The landing pad forming material 180A is physically or electrically connected to the contact plug 170 through the metal silicide film 172, and the contact plug 170 is electrically connected to the plurality of active areas 116 of the substrate 110 and thus is electrically connected to the capacitor lower electrode 190 (see FIG. 1) in a subsequent process.

The landing pad forming material 180A may be formed by depositing a conductive material by using CVD or PVD. The landing pad forming material 180A may be a conductive material such as a metal, a metal compound, or doped polysilicon. In FIGS. 8A through 8D, the landing pad forming material 180A may be formed of tungsten (W).

Figure 9:
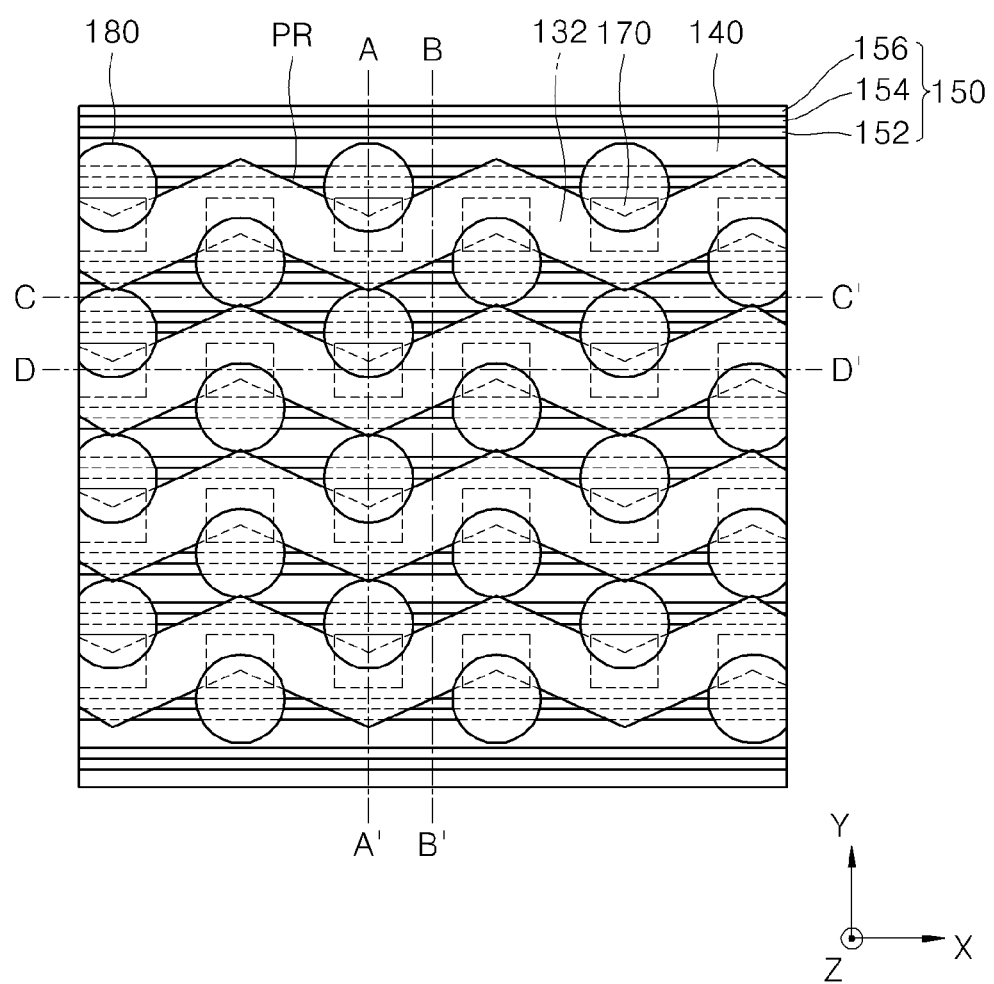
FIG. 9 is a plan view illustrating a cell array region for explaining a method of manufacturing the semiconductor device of FIG. 1, according to some embodiments of the inventive concepts.

FIG. 9 is a plan view illustrating a cell array region of the semiconductor device 100-1, according to an embodiment of the inventive concepts. Referring to FIG. 9, the landing pads 180 are formed in island shapes to contact portions of the plurality of conductive line structures 140 and portions of the contact plugs 170. The landing pad 180 is formed to simultaneously contact a portion of the contact plug 170 that is formed over one landing pad 180 in the second direction (Y direction) and portions of the insulating spacer structure 150 and the conductive line structure 140 that are formed under the one landing pad 180 in the second direction (Y direction), and the landing pad 180 that is formed adjacent to the one landing pad 180 in the first direction (X direction) is formed to simultaneously contact an upper portion of the contact plug 170 that is adjacent to the contact plug 170 in the first direction (X direction) and portions of the insulating spacer structure 150 and the conductive line structure 140 that are formed over the contact plug 170. That is, the landing pads 180 are not aligned in the first direction (X direction), and are arranged such that central portions contact bent edges of the etching mask patterns PR (see FIG. 5). Also, the landing pads 180 are arranged at regular intervals in the first direction (X direction) and the second direction (Y direction). In FIG. 9, an interval between the landing pads 180 is a constant pitch of 3 F. Each of the landing pads 180 is connected to each of the contact plugs 170, extends in the third direction (Z direction) perpendicular to the substrate 110 (see FIGS. 7A through 7D), and is connected to the capacitor lower electrode 190 (see FIG. 1) in a subsequent process.

Referring to FIGS. 10A through 10D, the landing pad recess 180R is formed by removing a portion of the landing pad forming material 180A, a portion of an upper portion of the insulating spacer structure 150, and a portion of an upper portion of the insulating capping layer 144. The landing pad recess 180R may be formed by performing an etching process using a mask pattern PR (see FIG. 9) having a shape conforming to the landing pad 180. The landing pad 180 is formed by separating the landing pad forming material 180A such that the landing pad forming material 180A is connected to an upper portion of each conductive line structure 140 due to the landing pad recess 180R. Also, since a top surface of the insulating spacer structure 150 is exposed due to the landing pad recess 180R, an empty space may be formed by selectively removing the second insulating spacer 154 that is an innermost layer in a three-layer structure of the insulating spacer structure 150 that is exposed through the landing pad recess 180R. The second insulating spacer 154 may be removed by using, for example, a wet etching method having an etching selectivity. In this case, an air spacer whose inside is empty may be formed by using the etching method using the second insulating spacer 154 as a sacrificial insulating film.

The air spacer may extend in a longitudinal direction of each of the plurality of conductive line structures 140. Since the air spacer is formed between the plurality of conductive lines 142 and the plurality of contact plugs 170 in a limited space of the semiconductor device 100-1 that is highly integrated and highly downscaled, a relative permittivity between the plurality of conductive lines 142 and the plurality of contact plugs 170 is reduced, thereby reducing a capacitance between adjacent conductive lines 142 or the conductive line 142 and the contact plug 170.

In the semiconductor device 100-1 described with reference to FIGS. 10A through 10D, a contact structure for electrically connecting the plurality of active areas 116 of the substrate 110 and the capacitor lower electrode 190 (see FIG. 1) includes the contact plug 170 that is connected to the plurality of active areas 116, and the landing pad 180 that is formed on the conductive line structure 140 to be connected to the contact plug 170 and to vertically overlap with the conductive line 142. In FIGS. 10A through 10D, the landing pad insulating film 160 may be disposed between the landing pad 180 and the upper portion of the conductive line structure 140. The capacitor lower electrode 190 is connected to the landing pad 180. Next, a capacitor including the capacitor lower electrode 190, a capacitor insulating film, and a capacitor upper electrode may be formed by sequentially forming the capacitor insulating film and the capacitor upper electrode on the capacitor lower electrode 190.

Figure 11:
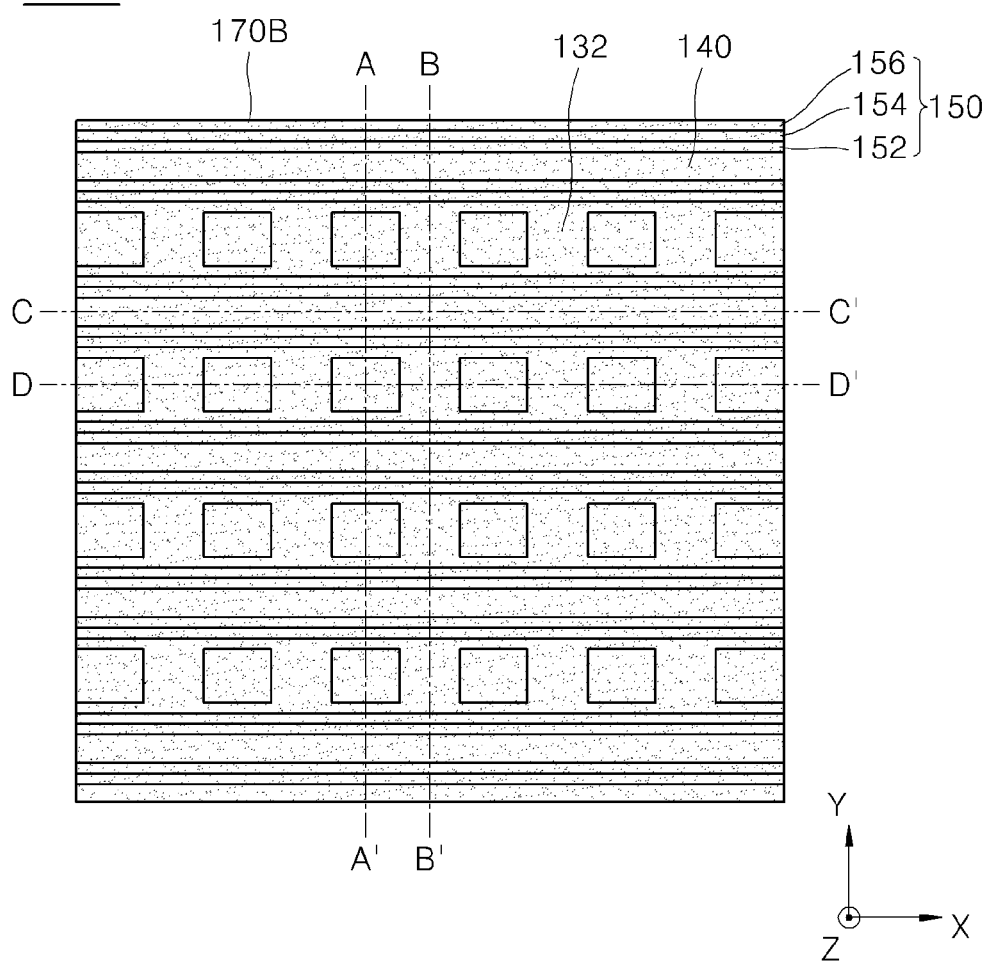
FIGS. 11, 13, and 17 are plan views illustrating a cell array region of the semiconductor device of FIG. 2, according to some embodiments of the inventive concepts.
Figure 12A:
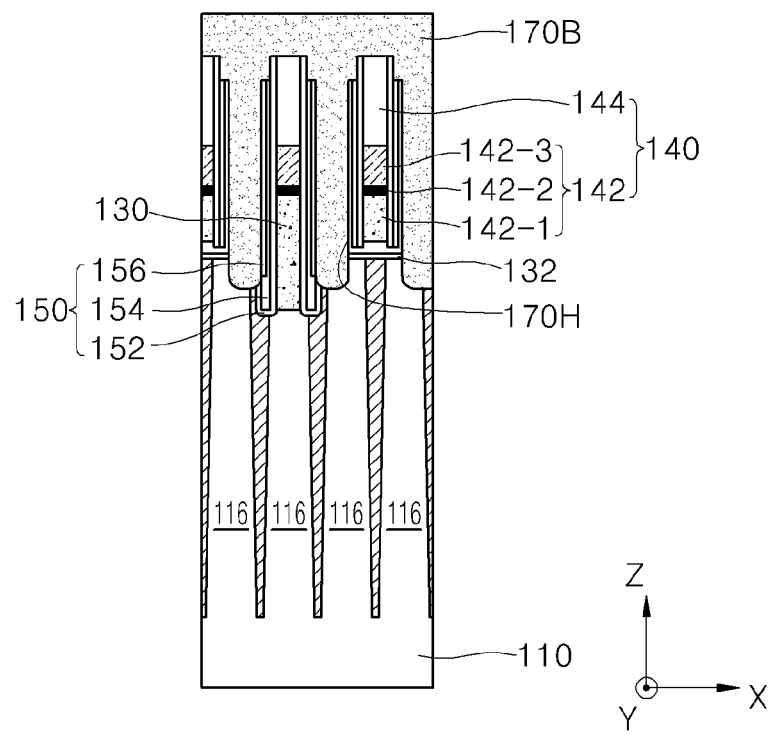
FIGS. 12A through 12D, 14A through 16D, and 18A through 18D are cross-sectional views according to a process order for explaining a method of manufacturing the semiconductor device of FIG. 2, according to some embodiments of the inventive concepts.
Figure 12B:
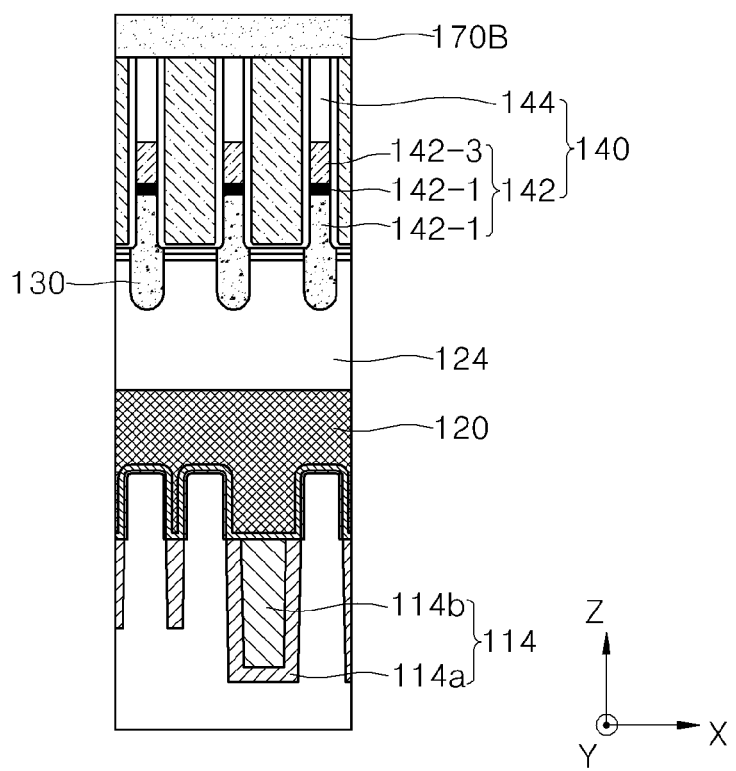
Figure 12C:
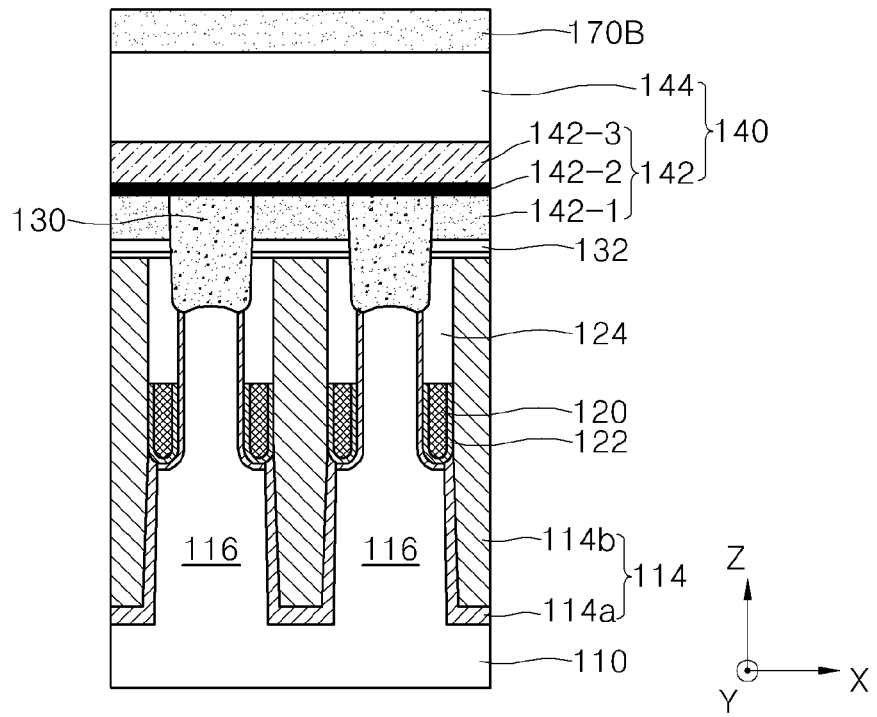
Figure 12D:
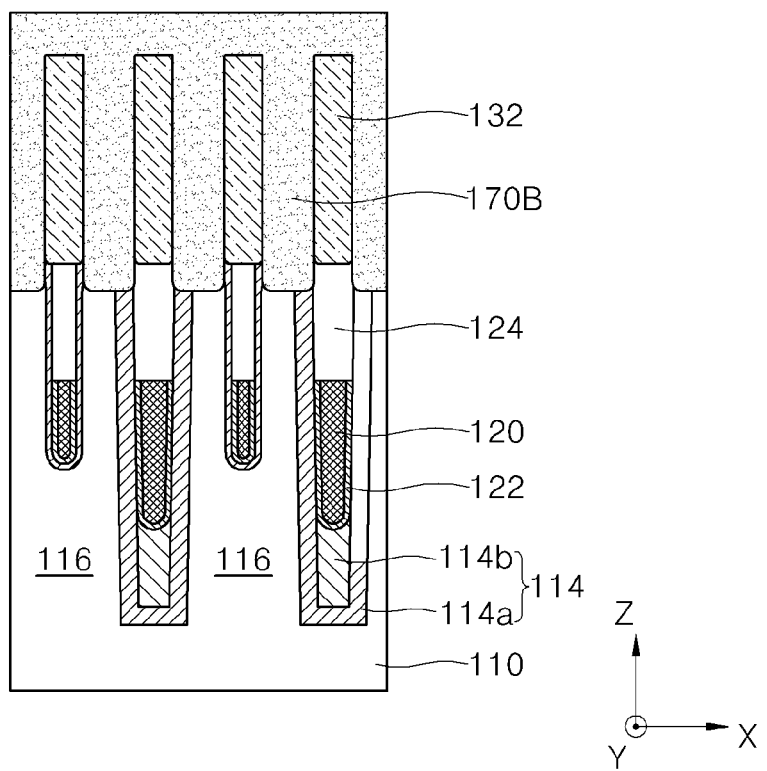
Figure 12E:
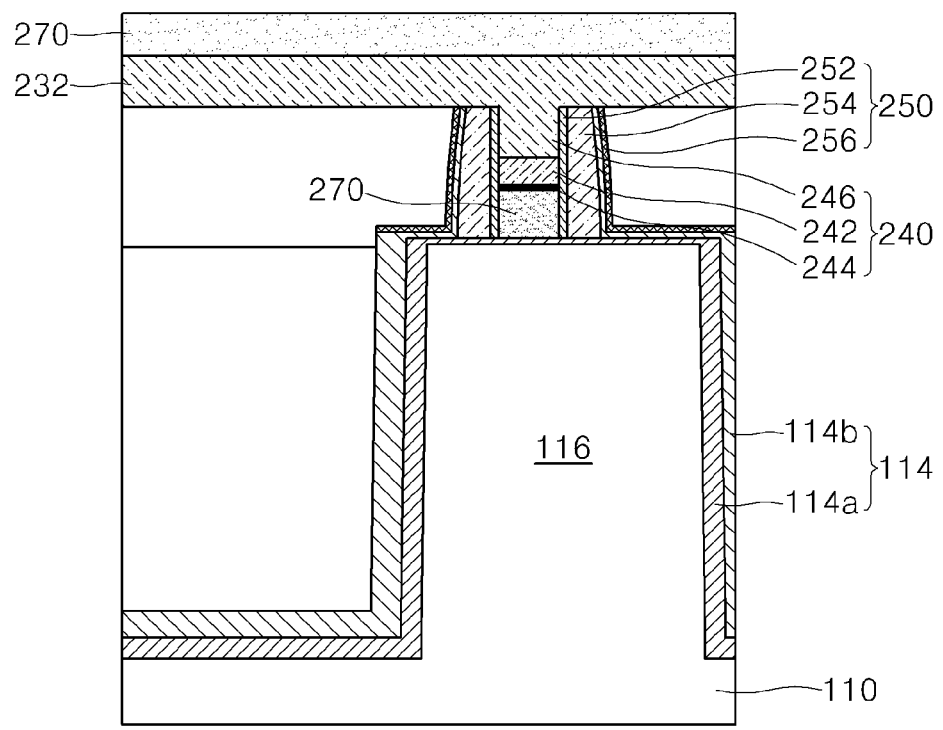
FIGS. 12E, 14E, 15E, 16E, and 18E are cross-sectional views illustrating some elements in the peripheral region for explaining a method of manufacturing the semiconductor device of FIG. 2, according to some embodiments of the inventive concepts.

FIG. 11 is a plan layout illustrating a cell array region of the semiconductor device 100-2 of FIG. 2, according to an embodiment of the inventive concepts. FIGS. 12A through 18D are cross-sectional views according to a process order for explaining a method of manufacturing the semiconductor device 100-2, according to an embodiment of the inventive concepts.

Referring to FIG. 11, the plan layout of FIG. 11 is substantially the same as the plan layout of the semiconductor device 100-1 of FIG. 3, but is different from the plan layout of the semiconductor device 100-1 of FIG. 3 in that a front surface is covered by a contact forming conductive layer 170B.

Referring to FIGS. 12A through 12D, the semiconductor device 100-2 may include the substrate 110, the plurality of conductive line structures 140 that are formed to be parallel to the upper surface of the substrate 110 with the first insulating pattern 132 there between, the insulating spacer structures 150 that contact both side walls of the plurality of conductive line structures 140, and the contact holes 170H that are each disposed between one pair of conductive line structures 140 and are formed in spaces that are defined by the insulating spacer structures 150. Each element has already been explained with reference to FIGS. 4A through 4D, and thus a repeated explanation thereof will not be given.

The contact forming conductive layer 170B is formed to fill each of the contact holes 170H and to cover an upper portion of each of the conductive line structures 140. The contact forming conductive layer 170B may be formed by using at least one deposition method selected from the group consisting of CVD, PVD, and silicon epitaxial growth. The contact forming conductive layer 170B may be formed of at least one conductive material selected from the group consisting of a semiconductor material, a metal, conductive metal nitride, and metal silicide which are doped with impurities. In FIGS. 12A through 12D, the contact forming conductive layer 170B may be formed of doped polysilicon.

Figure 13:
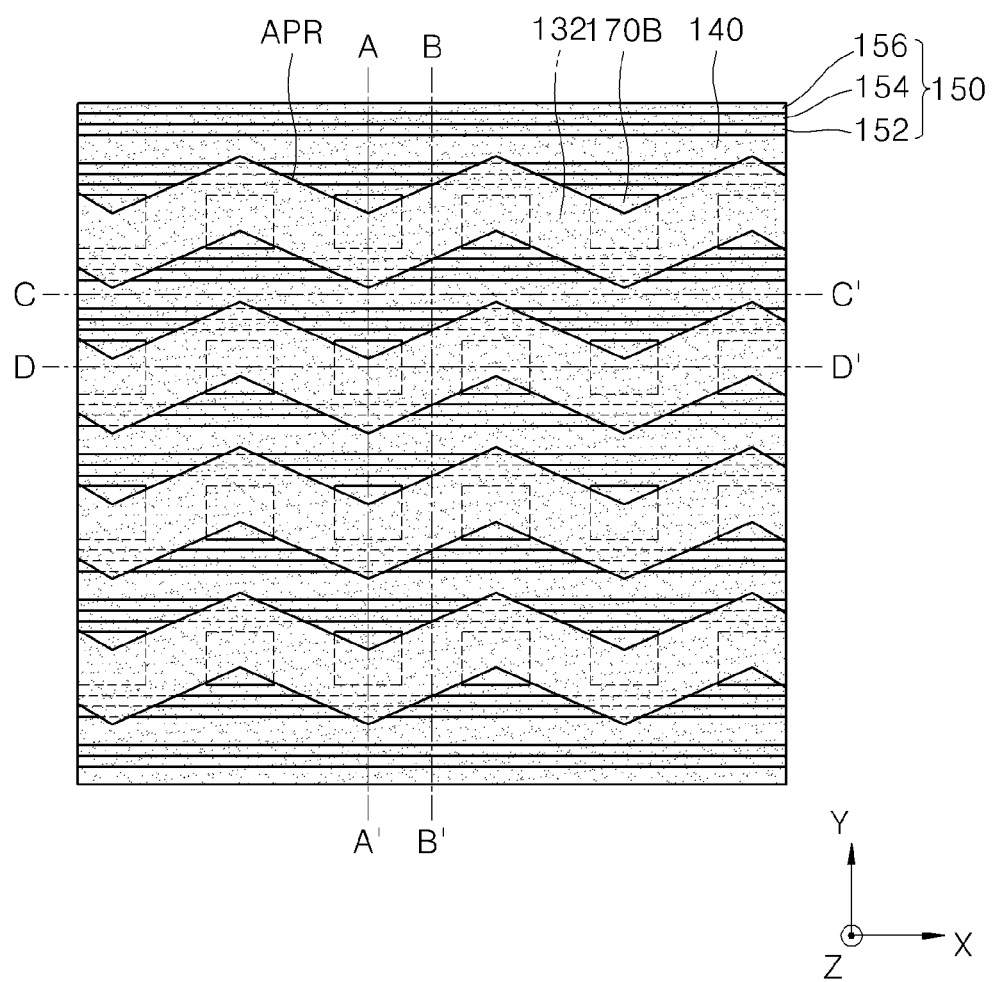
Figure 14A:
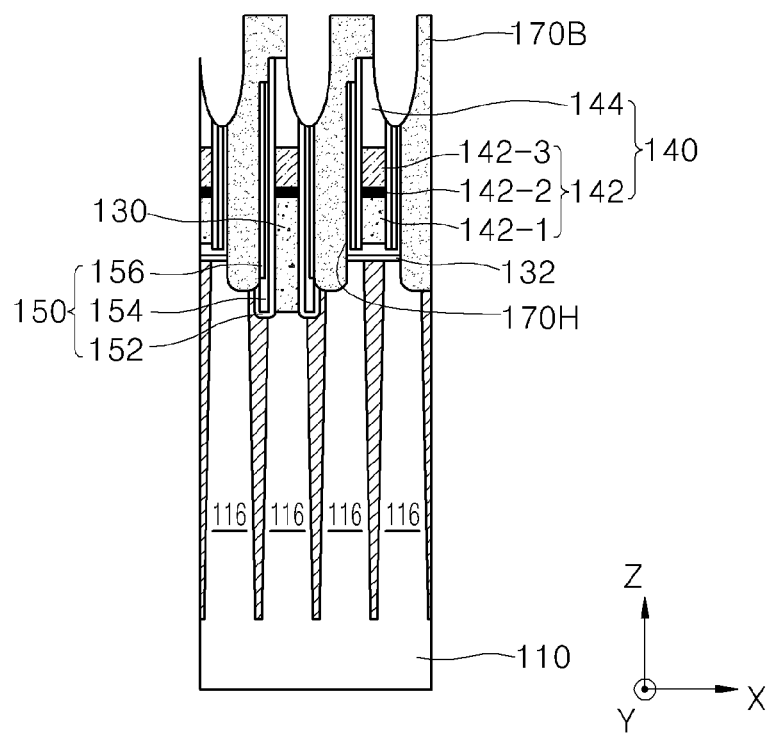
Figure 14B:
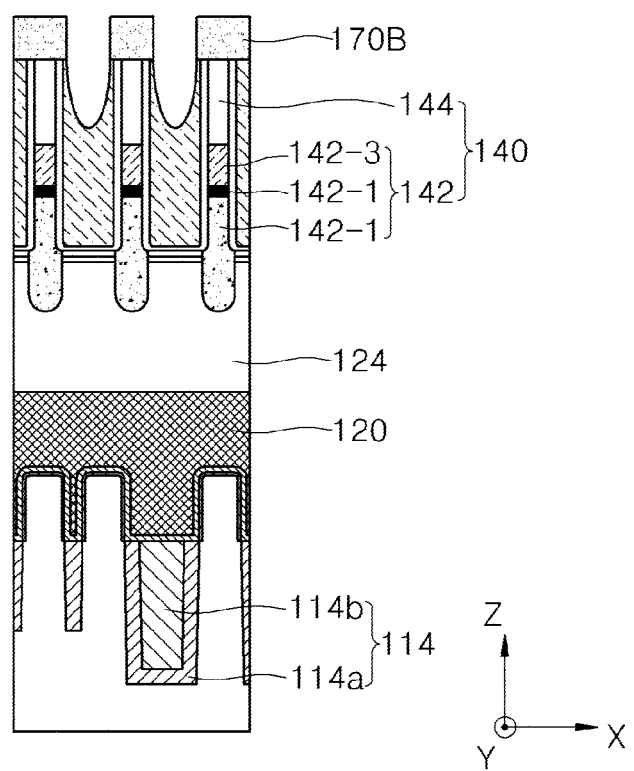
Figure 14C:
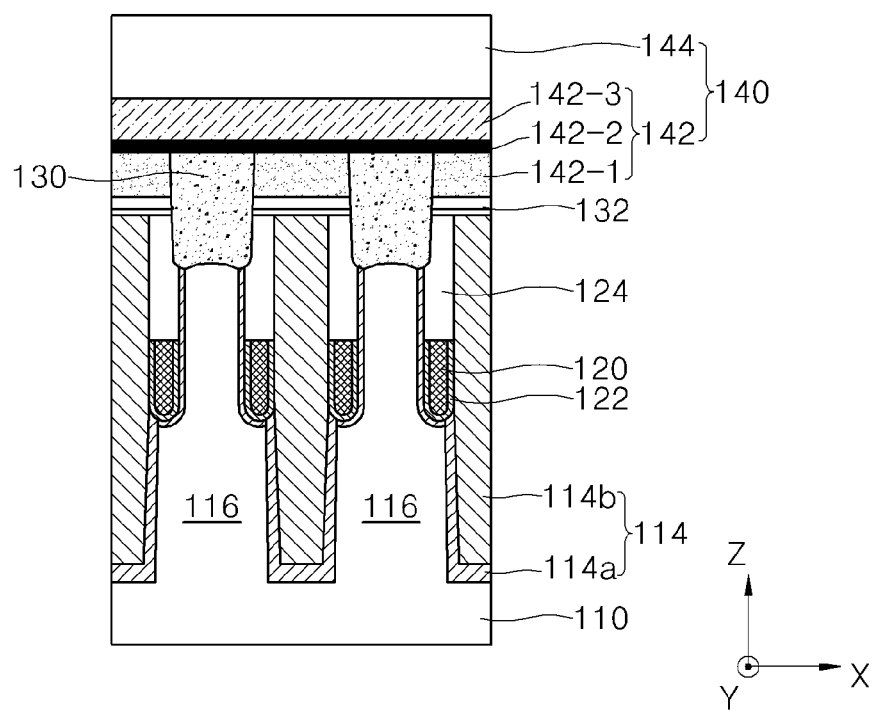
Figure 14D:
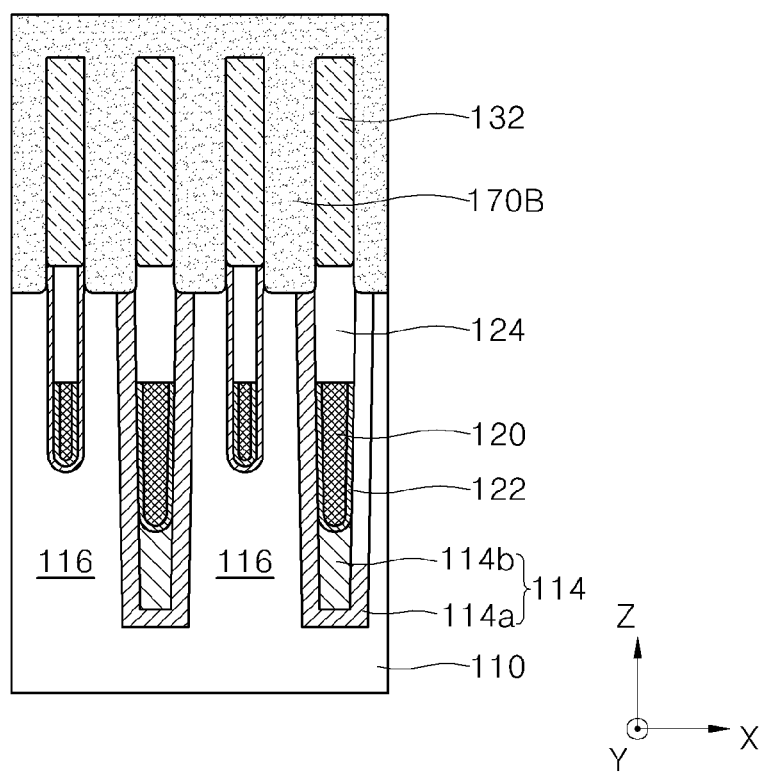
Figure 14E:
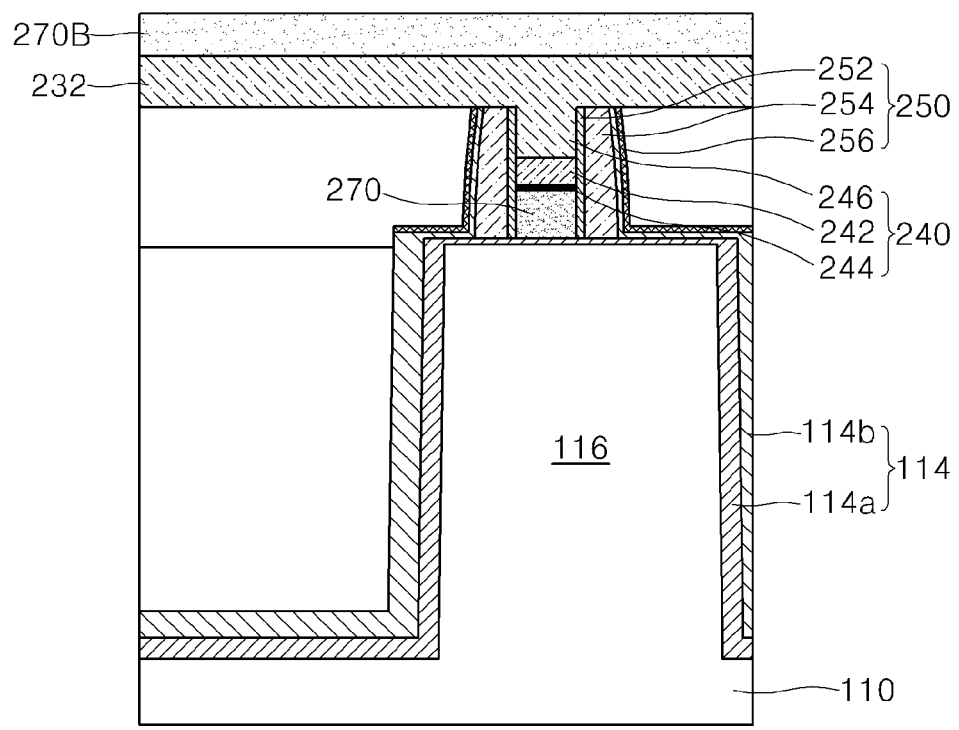
Figure 15A:
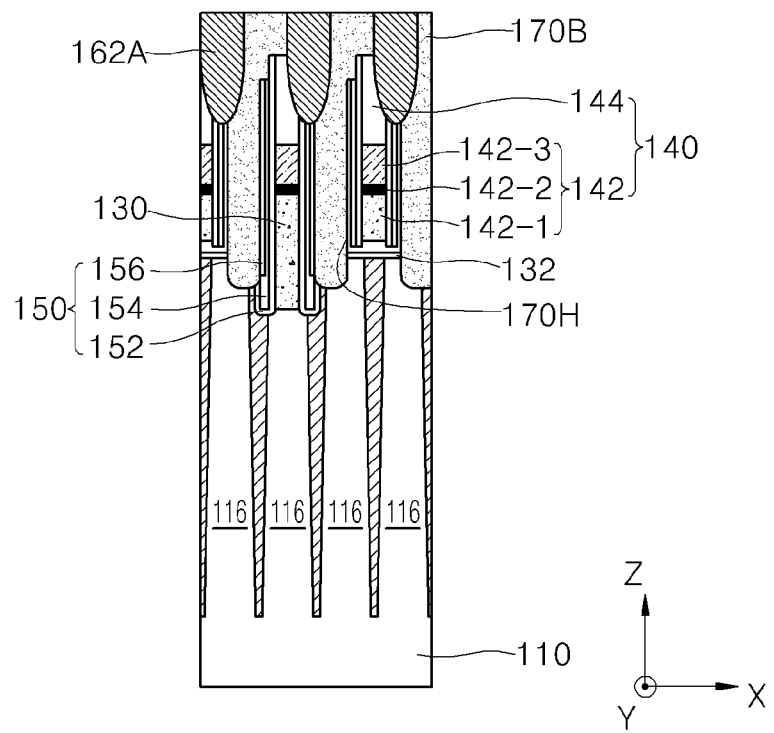
Figure 15B:
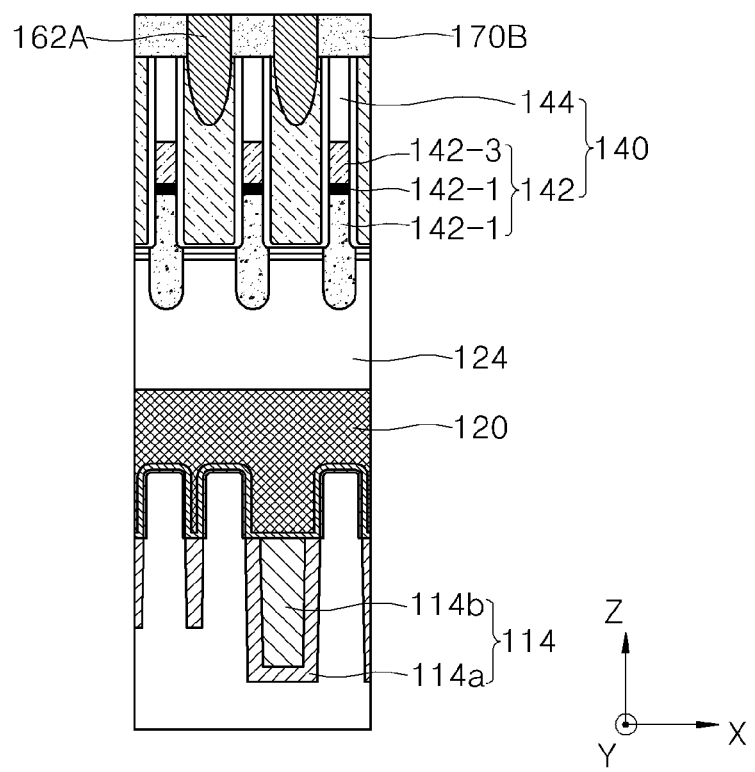
Figure 15C:
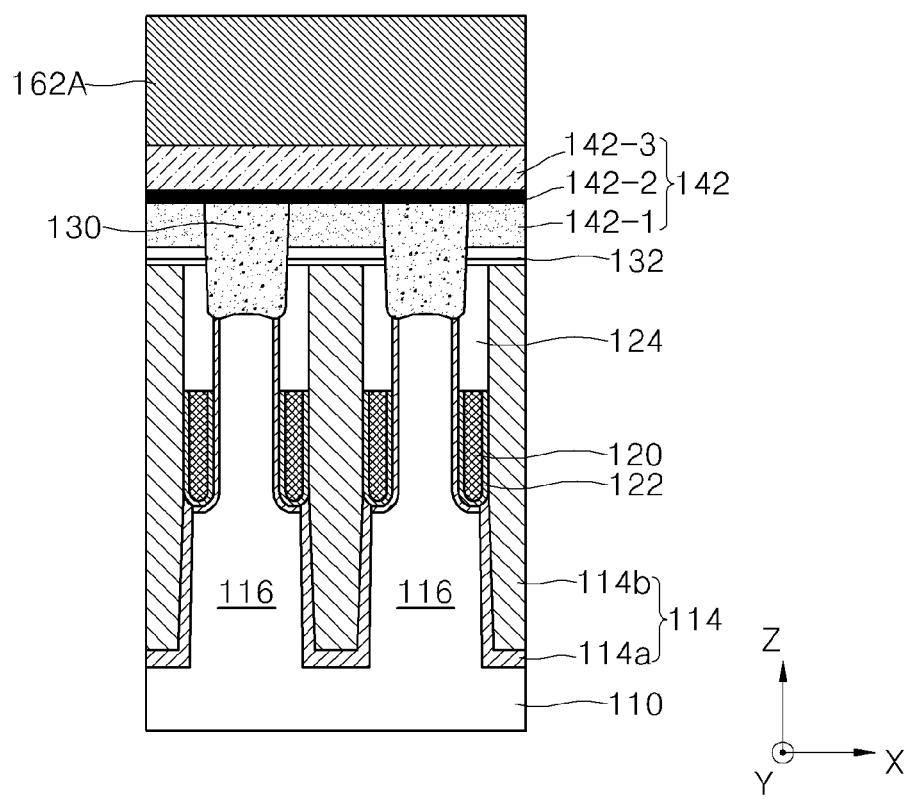
Figure 15D:
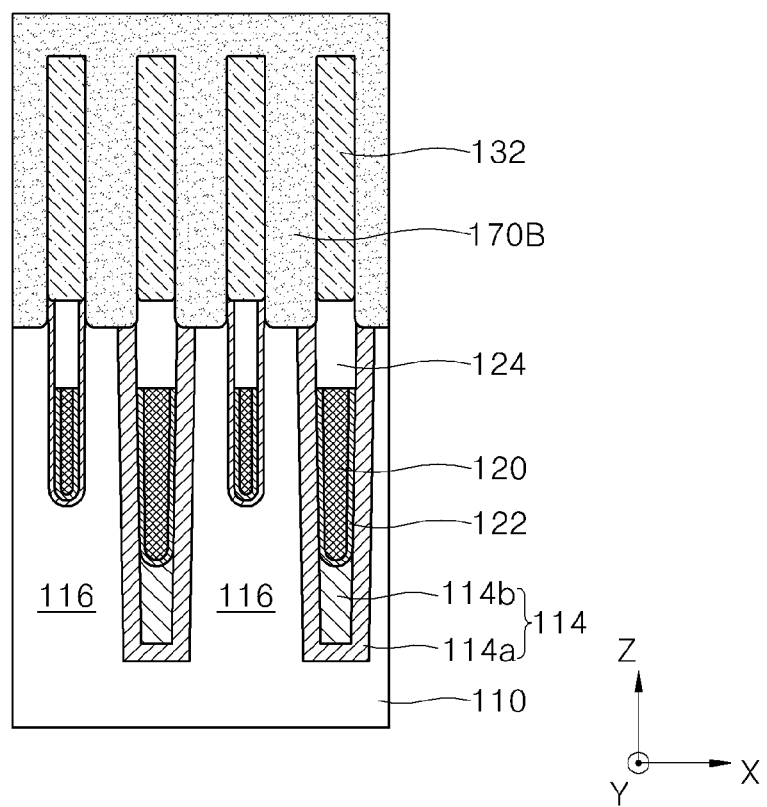
Figure 15E:
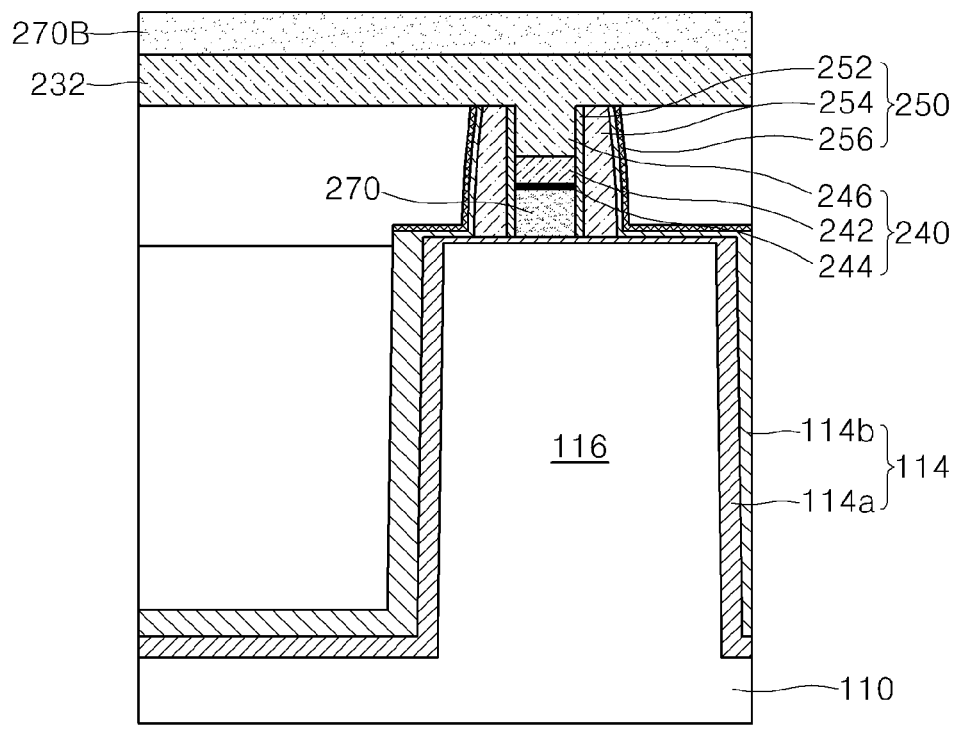
Figure 16A:
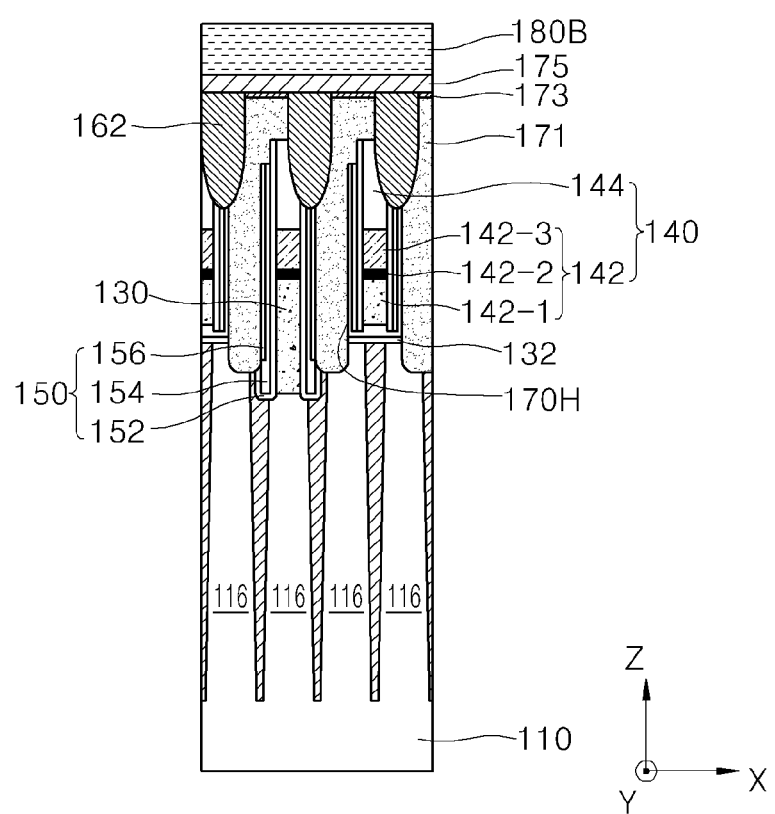
Figure 16B:
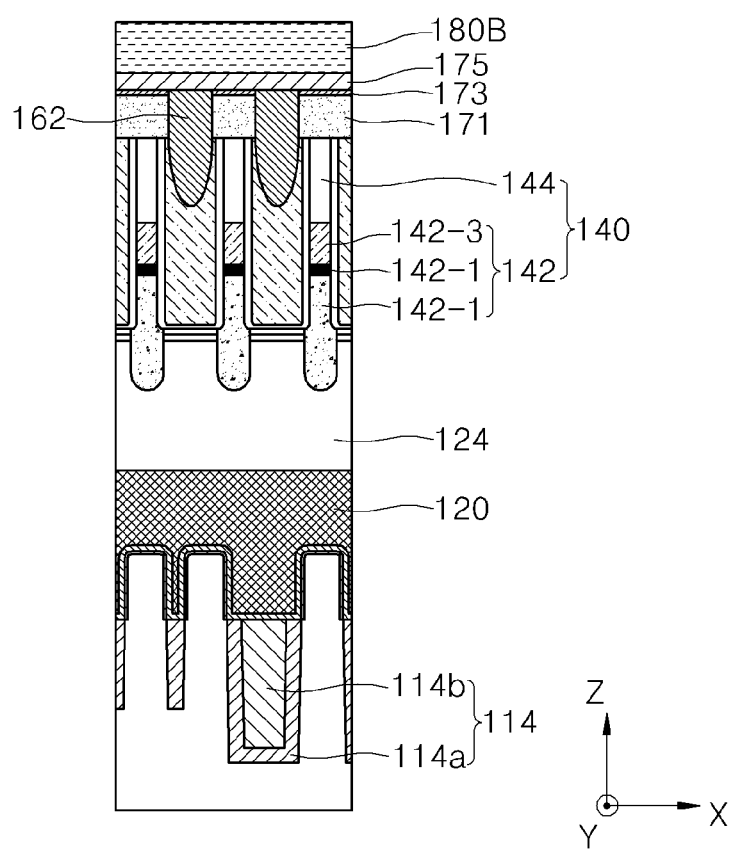
Figure 16C:
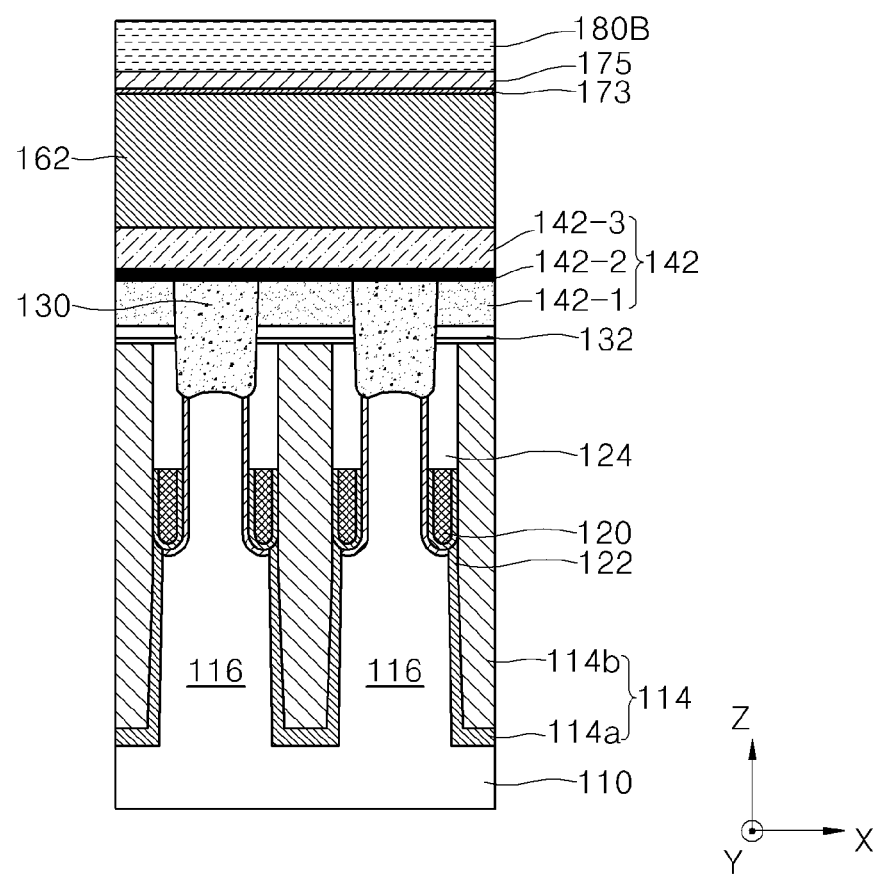
Figure 16D:
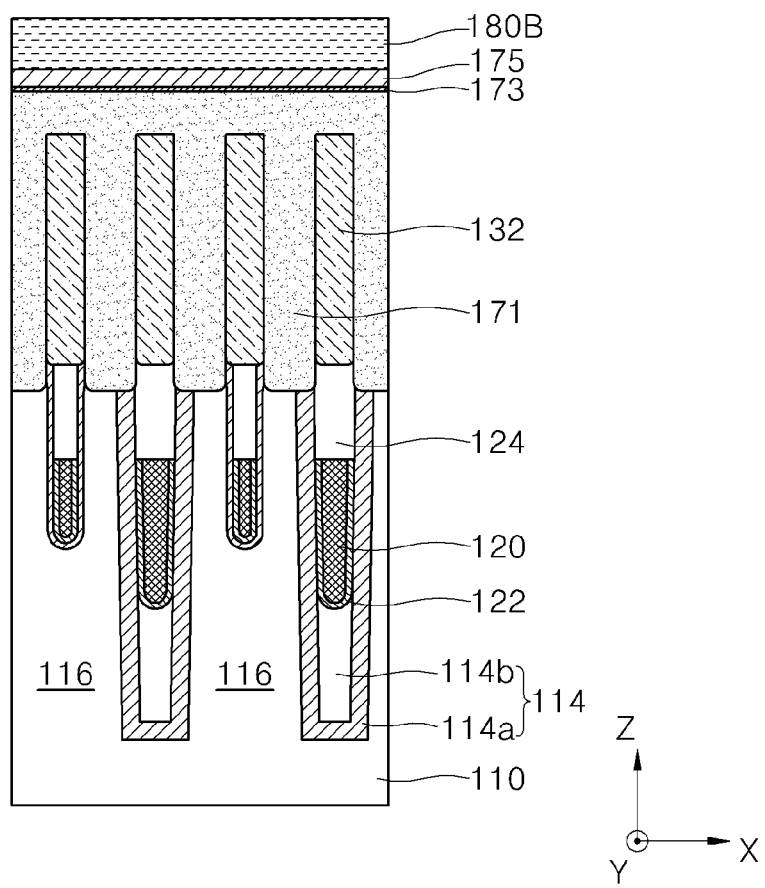
Figure 16E:
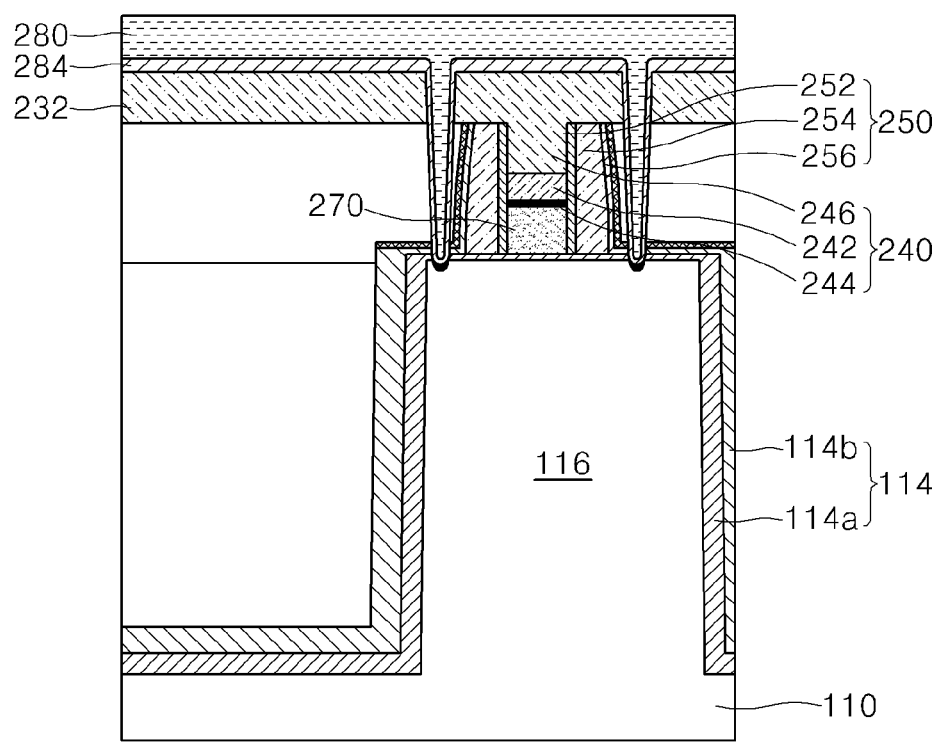

Referring to FIG. 13, an air spacer forming mask pattern APR is formed in a cell array region of the semiconductor device 100-2, and a portion other than a portion covered by the air spacer forming mask pattern APR is etched. The air spacer forming mask pattern APR that is a separate layer may be manufactured by using an exposure process and an etching process. The air spacer forming mask pattern APR is patterned in the cell array region to have a wave shape, like the etching mask pattern PR of FIG. 5. A shape of the air spacer forming mask pattern APR and a method of forming the air spacer forming mask pattern APR are the same as those of the etching mask pattern PR of FIG. 5, and thus a repeated explanation thereof will not be given.

Referring to FIGS. 14A through 14D, a portion of the insulating capping layer 144, a portion of the insulating spacer structure 150, and a portion of the contact forming conductive layer 170B are removed from a resultant structure including the air spacer forming mask pattern APR (see FIG. 13) in the cell array region of the semiconductor device 100-2 by being etched by using the air spacer forming mask pattern APR. Since the air spacer forming mask pattern APR is formed to alternately cover the insulating capping layer 144 and the insulating spacer structure 150 in the second direction (Y direction) with respect to the contact forming conductive layer 170B, FIGS. 14A through 14D illustrate that only upper portions of one side surfaces of the insulating spacer structure 150 and the insulating capping layer 144 are removed by being etched. A top surface of the insulating spacer structure 150 may be exposed during the etching process.

An air spacer is formed by injecting an etching solution that may selectively etch only a specific insulating film into the exposed top surface of the insulating spacer structure 150. In FIGS. 14A through 14D, only an insulating material film that constitutes the second insulating spacer 154 is removed by using a material that may selectively etch and remove the second insulating spacer 154 of the insulating spacer structure 150. Accordingly, the second insulating spacer 154 may become an air spacer in which air is filled.

Referring to FIGS. 15A through 15D, the air spacer forming mask pattern APR (see FIG. 13) is removed in the above process, and an insulating material is filled in an empty space that is formed due to the etching process.

The air spacer forming mask pattern APR may be removed by using an ashing process and a stripping process. After the air spacer forming mask pattern APR is removed, an insulating material film 162A that covers a recess that is formed due to the etching process and an upper portion of the contact forming conductive layer 170B is formed. A bottom surface of the insulating material film 162A is formed to contact an upper portion of the insulating spacer structure 150 and to cover a top surface of the second insulating spacer 154, that is, to close an upper portion of the air spacer. The insulating material film 162A may be at least one insulating film selected from the group consisting of a silicon oxide film, a silicon nitride film, a silicon oxynitride film, and a combination thereof. The insulating material film 162A may be formed by using CVD or PVD.

Next, the second insulating pattern 162 (see FIG. 16A) is formed by performing an etch-back process on a top surface of the insulating material film 162A until a top surface of the contact forming conductive layer 170B is exposed. When levels of uppermost end portions of the second insulating pattern 162 and the contact forming conductive layer 170B are the same, the contact plug 171 (see FIG. 16A) is formed by planarizing the top surface of the contact forming conductive layer 170B by using a chemical mechanical polishing (CMP) process or the like. A level of a top surface of the contact plug 171 may be lower than a level of a top surface of the second insulating pattern 162 due to the CMP process or the like.

Referring to FIGS. 16A through 16D, the metal silicide film 173 is formed on a top surface of the contact plug 171, a barrier film 175 is formed on a top surface of the metal silicide film 173, and then a landing pad forming material 180B that covers a top surface of the barrier film 175 is formed.

The metal silicide film 173 is formed outside the contact hole 170H, that is, is formed to have a level higher than that of the conductive line structure 140, unlike the metal silicide film 172 of FIGS. 8A through 8D. Also, since the metal silicide film 173 is separated by one pair of adjacent second insulating patterns 162, the metal silicide film 173 has a width grater than a width of the contact hole 170H in the first direction (X direction) parallel to the upper surface of the substrate 110.

The metal silicide film 173 may include at least one selected from the group consisting of cobalt silicide (CoSix), nickel silicide (NiSix), and manganese silicide (MnSix). In FIGS. 16A through 16D, the metal silicide film 173 may be formed of cobalt silicide (CoSix). A method of forming the metal silicide film 173 is the same as that described with reference to FIGS. 8A through 8D, and thus a repeated explanation thereof will not be given.

After the metal silicide film 173 is formed, the barrier film 175 that covers top surfaces of the metal silicide film 173 and the first insulating pattern 132 may be formed. The barrier film 175 may extend in the first direction.

The first direction (X direction) parallel to the upper surface of the substrate 110, unlike the barrier film 174 of FIGS. 8A through 8D. In FIGS. 16A through 16D, the barrier film 175 may have a Ti/TiN stacked structure.

Next, the landing pad forming material 180B that covers the top surface of the barrier film 175 is formed. The landing pad forming material 180B is formed such that a bottom surface of the landing pad forming material 180B extends in the first direction (X direction) parallel to the upper surface of the substrate 110, unlike the landing pad forming material 180A of FIGS. 8A through 8D. That is, the landing pad forming material 180B is formed to contact the top surface of the barrier film 175 and to extend in parallel. The landing pad forming material 180B may be formed by filling a conductive material by using CVD or PVD. The landing pad forming material 180B may be formed of a conductive material such as a metal, a metal compound, or doped polysilicon. In FIGS. 16A through 16D, the landing pad forming material 180B may be formed of tungsten (W).

Figure 17:
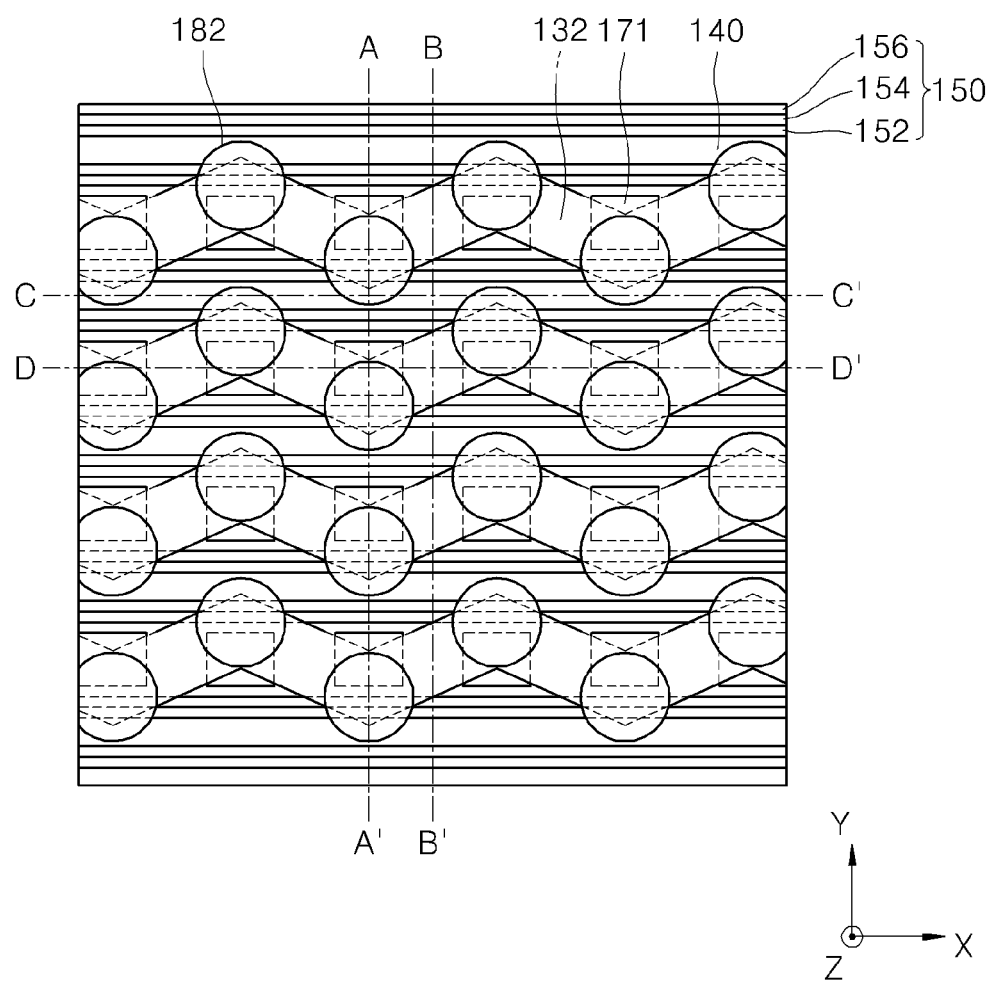

FIG. 17 is a plan view illustrating a cell array region of the semiconductor device 100-2, according to an embodiment of the inventive concepts.

Referring to FIG. 17, the landing pads 182 are formed in island shapes to contact portions of the conductive line structures 140 and portions of the contact plugs 170. The landing pads 182 are not aligned in the first direction (X direction), and are arranged such that central portions contact bent edges of the etching mask patterns PR (see FIG. 9), like the landing pad 180 of FIG. 9. Also, the landing pads 182 are arranged at regular intervals in the first direction (X direction) and the second direction (Y direction). In FIG. 17, an interval between the landing pads 182 is a constant pitch of 3 F.

Referring to FIGS. 18A through 18D, the landing pad 182 is formed by separating the landing pad forming material 180 by etching and removing a top surface of the landing pad forming material 180B by using a mask pattern (see FIG. 17) having a shape conforming to the landing pad 182. A portion of the landing pad forming material 180B and a side surface an upper portion of the second insulating pattern 162 are removed during the etching process, unlike in FIGS. 10A through 10D in which the landing pad 180 is formed by removing a portion of the conductive line structure 140 and a portion of the insulating spacer structure 150 of the semiconductor device 100-1.

The landing pad 182 fills the entire contact hole 170H, and is connected to the contact plug 171 that overlaps to cover an upper portion of the conductive line structure 140. Since a size of a width of an upper end portion of the contact plug 171 is greater than a size of a width of the contact hole 170H in the first direction (X direction) parallel to the upper surface of the substrate 110, an area of a contact width between the landing pad 182 and the contact plug 171 in the first direction (X direction) may be increased.

Also, since a process of forming an air spacer is performed before the landing pad 182 is formed unlike in FIGS. 10A through 10D, erosion of the metal silicide film 173 which occurs during a process of etching the second insulating spacer 154 for forming the air spacer may be mitigated or prevented.

Figure 19:
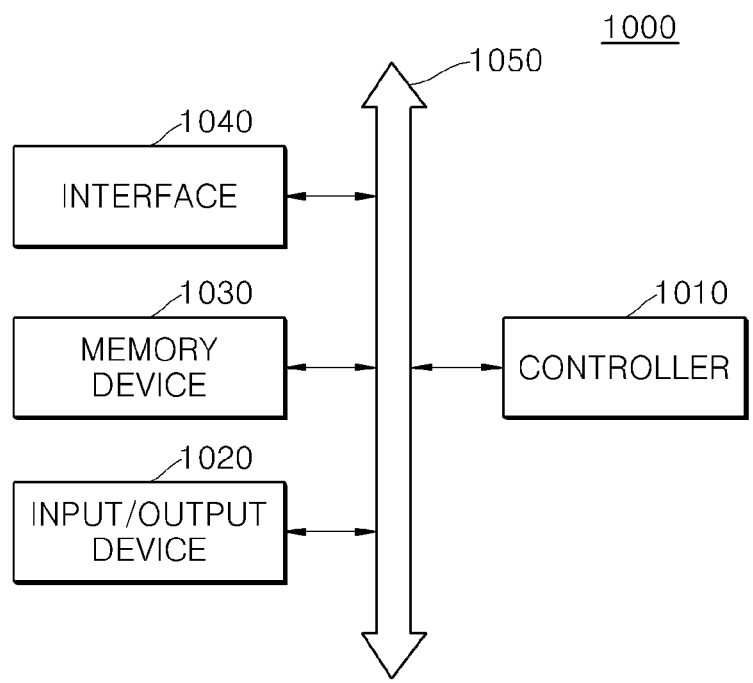
FIG. 19 is a block diagram illustrating a system including a semiconductor device, according to an embodiment of the inventive concepts.

FIG. 19 is a block diagram illustrating a system 1000 including a semiconductor device, according to an embodiment of the inventive concepts.

The system 1000 includes a controller 1010, an input/output device 1020, a memory device 1030, and an interface 1040. The system 1000 may be a mobile system or a system that transmits or receives information. In some embodiments, examples of the mobile system may include a personal digital assistant (PDA), a portable computer, a web tablet, a wireless phone, a mobile phone, a digital music player, and a memory card. Examples of the controller 1010 for controlling an execution program in the system 1000 may include a microprocessor, a digital signal processor, and a microcontroller. The input/output device 1020 is used to input or output data to or from the system 1000. The system 1000 may be connected to an external device, such as a personal computer or a network, by using the input/output device 1020, and may exchange data with the external device. Examples of the input/output device 1020 may include a keypad, a keyboard, and a display device.

The memory device 1030 may store code and/or data for operating the controller 1010, or may store data processed by the controller 1010. The memory device 1030 includes a semiconductor device including a fin TFT. For example, the memory device 1030 may include at least one of the semiconductor devices 100-1 and 100-2 of FIGS. 1 and 2.

The interface 1040 may be a data transmission path between the system 1000 and an external device. The controller 1010, the input/output device 1020, the memory device 1030, and the interface 1040 may communicate with one another via a bus 1050. The system 1000 may be applied to a mobile phone, an MP3 player, a navigation system, a portable multimedia player (PMP), a solid-state disk (SSD), or a household appliance.

Figure 20:
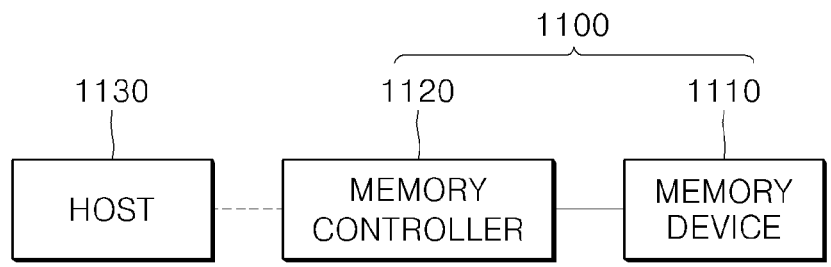
FIG. 20 is a block diagram illustrating a memory card including a semiconductor device, according to an embodiment of the inventive concepts.

FIG. 20 is a block diagram illustrating a memory card 1100 including a semiconductor device, according to an embodiment of the inventive concepts.

The memory card 1100 includes a memory device 1110 and a memory controller 1120.

The memory device 1110 may store data. In some embodiments, the memory device 1110 may have nonvolatile characteristics and thus may retain stored data even when not powered. The memory device 1110 may include at least one of the semiconductor devices 100-1 and 100-2 of FIGS. 1 and 2.

The memory controller 1120 may read data that is stored in the memory device 1110 or may store data in the memory device 1110 in response to a read/write request. The memory controller 1120 may include at least one of the semiconductor devices 100-1 and 100-2 of FIGS. 1 and 2.

While the inventive concepts has been particularly shown and described with reference to exemplary embodiments thereof, it will be understood that various changes in form and details may be made therein without departing from the spirit and scope of the following claims.

What is claimed is:
1. A semiconductor device comprising:
a substrate having a plurality of active areas;
a plurality of conductive line structures including a plurality of conductive lines spaced apart from the substrate with an insulating film there between and insulating capping layer formed on each of the plurality of conductive lines;

an insulating spacer disposed between the plurality of conductive line structures, the insulating spacer covering both side walls of each of the plurality of conductive line structures to define a contact hole having a first width in a first direction parallel to an upper surface of the substrate;

a contact plug filling a portion of the contact hole; and a landing pad connected to the contact plug and vertically overlapping with one of the plurality of conductive line structures, wherein a lower end portion of the landing pad has a second width less than the first width in the first direction and an upper end portion of the landing pad has a third width greater than the first width in the first direction, wherein a fourth width of an upper end portion of the insulating capping layer in the first direction is less than a fifth width of a lower end portion of the insulating capping layer.

2. The semiconductor device of claim 1, wherein a cross-section of the insulating capping layer in the first direction tapers such that a width decreases from the lower end portion to the upper end portion of the insulating capping layer.

3. The semiconductor device of claim 1, wherein a level of an uppermost portion of the insulating spacer is lower than a level of an uppermost portion of the insulating capping layer.

4. The semiconductor device of claim 1, wherein the insulating spacer comprises an air spacer.

5. The semiconductor device of claim 1, further comprising:
an insulating pattern that contacts a side surface of the upper end portion of the insulating capping layer and contacts an upper portion of the insulating spacer formed on a same side surface as the one side surface of the upper end portion of the insulating capping layer.

6. The semiconductor device of claim 1, wherein the contact plug extends from an inside of the contact hole to an outside of the contact hole and vertically overlaps with an upper portion of the insulating capping layer and an upper portion of the insulating spacer.

7. The semiconductor device of claim 1, further comprising:
a metal silicide film disposed in the contact hole, the metal silicide film being disposed between the contact plug and the landing pad,
wherein a level of a top surface of the metal silicide film is lower than a level of a top surface of the insulating capping layer.

8. The semiconductor device of claim 1, further comprising:
a metal silicide film that is formed between the contact plug and the landing pad,
wherein the metal silicide film is formed outside the contact hole and over the upper portion of the insulating capping layer.

9. The semiconductor device of claim 1, further comprising:
a conductive barrier film that contacts a side surface and a top surface of the insulating spacer and a side surface of an upper portion of the insulating capping layer, and surrounds the landing pad.

10. A semiconductor device comprising:
a substrate having a plurality of active areas;
a plurality of conductive lines spaced apart from the substrate with an insulating film there between;
a plurality of insulating capping layers that contact top surfaces of the plurality of conductive lines, the plurality of insulating capping layers having same widths as widths of the plurality of conductive lines;

an insulating spacer contacting to both side surfaces of each of the plurality of conductive lines and the plurality of insulating capping layers;

a contact plug disposed between the plurality of conductive lines and formed in a space, the space being defined by the insulating spacer; and an insulating pattern formed to simultaneously contact a side surface of an upper end portion of the insulating capping layer and a portion of the contact plug, wherein a size of a width of an upper end portion of the contact plug in a first direction parallel to an upper surface of the substrate is greater than a size of a width of a lower end portion of the contact plug.

11. The semiconductor device of claim 10, wherein the contact plug extends in a second direction perpendicular to the substrate to overlap with an upper portion of the insulating capping layer and an upper portion of the insulating spacer.

12. The semiconductor device of claim 10, further comprising:
a landing pad connected to the contact plug and vertically overlapping with one of the plurality of conductive lines,
wherein a size of a width of the landing pad in the first direction is greater than a size of a width of the upper end portion of the contact plug in the first direction.

13. The semiconductor device of claim 10, wherein the landing pad has a pillar shape.

14. The semiconductor device of claim 12, further comprising:
a metal silicide film disposed between an upper surface of the contact plug and the landing pad,
wherein a size of a width of the metal silicide film in the first direction is the same as the size of the width of the upper end portion of the contact plug in the first direction.

15. A semiconductor device comprising:
a substrate having a plurality of active areas;
a plurality of conductive line structures including a plurality of conductive lines spaced apart from the substrate with an insulating film there between and insulating capping layer formed on each of the plurality of conductive lines;

an insulating spacer disposed between the plurality of conductive line structures, the insulating spacer covering both side walls of each of the plurality of conductive line structures to define a contact hole having a first width in a first direction parallel to an upper surface of the substrate;

a contact plug filling a portion of the contact hole, the contact plug being electrically connected to at least one of the plurality of active areas;

a landing pad connected to the contact plug and vertically overlapping with one of the plurality of conductive line structures; and an insulating pattern contacting a side surface of the upper end portion of the insulating capping layer and an upper portion of the insulating spacer formed on the same side surface as the one side surface of the upper end portion of the insulating capping layer, wherein a lower end portion of the landing pad has a second width less than the first width in the first direction, and an upper end portion of the landing pad has a third width greater than the first width in the first direction, wherein a fourth width of an upper end portion of the insulating capping layer in the first direction is less than a fifth width of a lower end portion of the insulating capping layer.

16. The semiconductor device of claim 15, wherein the contact plug extends from an inside of the contact hole to an outside of the contact hole and vertically overlaps with an upper portion of the insulating capping layer and an upper portion of the insulating spacer.

17. The semiconductor device of claim 15, further comprising:
a metal silicide film disposed in the contact hole, the metal silicide film being disposed between the contact plug and the landing pad,
wherein a level of a top surface of the metal silicide film is lower than a level of a top surface of the insulating capping layer.

18. The semiconductor device of claim 15, further comprising:
a metal silicide film that is formed between the contact plug and the landing pad,
wherein the metal silicide film is formed outside the contact hole and over the upper portion of the insulating capping layer.

19. The semiconductor device of claim 15, further comprising:
a conductive barrier film that contacts a side surface and a top surface of the insulating spacer and a side surface of an upper portion of the insulating capping layer, and surrounds the landing pad.

* * * * *